(12) United States Patent
Balakrishnan et al.

(10) Patent No.: US 10,038,053 B2
(45) Date of Patent: Jul. 31, 2018

(54) METHODS FOR REMOVAL OF SELECTED NANOWIRES IN STACKED GATE ALL AROUND ARCHITECTURE

(71) Applicant: International Business Machines Corporation, Armonk, NY (US)

(72) Inventors: Karthik Balakrishnan, White Plains, NY (US); Kangguo Cheng, Schenectady, NY (US); Pouya Hashemi, White Plains, NY (US); Alexander Reznicek, Troy, NY (US)

(73) Assignee: International Business Machines Corporation, Armonk, NY (US)

( * ) Notice: Subject to any disclaimer, the term of this patent is extended or adjusted under 35 U.S.C. 154(b) by 132 days.

(21) Appl. No.: 14/880,362

(22) Filed: Oct. 12, 2015

(65) Prior Publication Data

US 2017/0104060 A1    Apr. 13, 2017

(51) Int. Cl.
*H01L 29/423* (2006.01)
*H01L 29/06* (2006.01)
(Continued)

(52) U.S. Cl.
CPC ...... *H01L 29/0673* (2013.01); *H01L 21/0245* (2013.01); *H01L 21/02164* (2013.01);
(Continued)

(58) Field of Classification Search
CPC ........... H01L 21/02532; H01L 21/0245; H01L 21/324; H01L 21/845; H01L 27/1211;
(Continued)

(56) References Cited

U.S. PATENT DOCUMENTS 7,132,322 B1 * 11/2006 Greene ........... H01L 21/823842
257/E21.637
7,446,025 B2 11/2008 Cohen et al.
(Continued)

FOREIGN PATENT DOCUMENTS

CN    102623321 A    8/2012
CN    102623322 A    8/2012
(Continued)

OTHER PUBLICATIONS

L. K. Bera et al., "Three Dimensionally Stacked SiGe Nanowire Array and Gate-All-Around p-MOSFETs", Intitute of Microelectronics, Electron Devices Meeting, 2006. IEDM '06. International, Dec. 11-13, 2006.
(Continued)

*Primary Examiner* — Daniel Luke
*Assistant Examiner* — Khatib Rahman
(74) *Attorney, Agent, or Firm* — Harrington & Smith; Louis J. Percello

(57) ABSTRACT

A method forms first and second sets of fins. The first set includes a first stack of layer pairs where each layer pair contains a layer of Si having a first thickness and a layer of SiGe having a second thickness. The second set of fins includes a second stack of layer pairs where at least one layer pair contains a layer of Si having the first thickness and a layer of SiGe having a third thickness greater than the second thickness. The method further includes removing the layers of SiGe from the first stack leaving first stacked Si nanowires spaced apart by a first distance and from the second stack leaving second stacked Si nanowires spaced apart by a second distance corresponding to the third thickness. The method further includes forming a first dielectric layer on the first nanowires and a second, thicker dielectric layer on the second nanowires.

10 Claims, 18 Drawing Sheets

(51) Int. Cl.
| | |
|---|---|
| *H01L 21/02* | (2006.01) |
| *H01L 21/324* | (2006.01) |
| *H01L 21/84* | (2006.01) |
| *H01L 27/12* | (2006.01) |
| *H01L 29/49* | (2006.01) |
| *H01L 21/8234* | (2006.01) |
| *H01L 21/8238* | (2006.01) |
| *H01L 29/66* | (2006.01) |
| *H01L 29/775* | (2006.01) |
| *H01L 29/51* | (2006.01) |

(52) U.S. Cl.
CPC ...... *H01L 21/02532* (2013.01); *H01L 21/324* (2013.01); *H01L 21/823412* (2013.01); *H01L 21/823431* (2013.01); *H01L 21/823462* (2013.01); *H01L 21/823807* (2013.01); *H01L 21/823857* (2013.01); *H01L 21/845* (2013.01); *H01L 27/1211* (2013.01); *H01L 29/42392* (2013.01); *H01L 29/495* (2013.01); *H01L 29/66439* (2013.01); *H01L 29/775* (2013.01); *H01L 29/42364* (2013.01); *H01L 29/513* (2013.01)

(58) Field of Classification Search
CPC ............... H01L 29/16; H01L 29/42392; H01L 21/02164; H01L 29/42364; H01L 29/78696; H01L 21/823412; H01L 21/823431; H01L 21/823462; H01L 21/823807; H01L 21/823857; H01L 21/823821; H01L 29/0673; H01L 29/0669; H01L 29/517; H01L 29/513; H01L 29/153; H01L 29/495–29/4975
See application file for complete search history.

(56) References Cited

U.S. PATENT DOCUMENTS

| | | |
|---|---|---|
| 7,462,538 B2 * | 12/2008 | Li .................... H01L 21/823821 257/274 |
| 7,884,004 B2 | 2/2011 | Bangsaruntip et al. |
| 8,422,273 B2 | 4/2013 | Chang et al. |
| 2011/0012176 A1 * | 1/2011 | Chidambarrao ....... B82Y 10/00 257/255 |
| 2014/0151639 A1 * | 6/2014 | Chang ............... H01L 29/42392 257/27 |
| 2015/0035071 A1 * | 2/2015 | Ching .................. H01L 27/092 257/369 |
| 2017/0018462 A1 * | 1/2017 | Suk .................. H01L 29/78681 |

FOREIGN PATENT DOCUMENTS

| | | |
|---|---|---|
| CN | 102623338 A | 8/2012 |
| CN | 102623384 A | 8/2012 |
| CN | 102623385 A | 8/2012 |
| CN | 102646598 A | 8/2012 |

OTHER PUBLICATIONS

W.W. Fang et al., "Vertically Stacked SiGe Nanowire Array Channel CMOS Transistors", IEEE Electron Device Letters vol. 28, No. 3, Mar. 2007.

* cited by examiner

US 10,038,053 B2

METHODS FOR REMOVAL OF SELECTED NANOWIRES IN STACKED GATE ALL AROUND ARCHITECTURE

TECHNICAL FIELD

The various embodiments of this invention relate generally to semiconductor devices and fabrication techniques and, more specifically, relate to the fabrication of semiconductor transistor devices that include field effect transistor (FET) channels containing nanowires (NWs).

BACKGROUND

An ability to remove a selected NW or NWs in a three dimensional stacked NW architecture is expected to be an important feature for future complementary metal oxide semiconductor (CMOS) devices, such as those having a gate all around (GAA) architecture. In addition, thick gate dielectric devices are very important for system on chip (SoC) applications, as they are used for input/output (I/O) circuits, analog circuits and other applications. The use of the GAA architecture is expected to become widespread due at least to the excellent electrostatics inherent in the GAA devices.

SUMMARY

In a first aspect thereof the embodiments of this invention provide a method that comprises forming over a common substrate a first set of fins and a second set of fins both having a same total thickness. The first set of fins comprises a first stack comprised of a plurality of layer pairs where each layer pair is comprised of a layer of Si having a first thickness and a layer of SiGe having a second thickness. The second set of fins comprises a second stack comprised of a plurality of layer pairs where at least one layer pair is comprised of a layer of Si having the first thickness and a layer of SiGe having a third thickness, where the second thickness is less than the third thickness. The method further comprises removing the layers of SiGe from the first stack leaving a first plurality of vertically stacked first Si nanowires that are spaced apart by a first distance corresponding to the second thickness; removing the layers of SiGe from the second stack leaving a second plurality of vertically stacked second Si nanowires that are spaced apart by a second distance corresponding to the third thickness, where there are fewer vertically stacked second Si nanowires than vertically stacked first Si nanowires; and forming a first oxide layer and a metal layer on each of the first Si nanowires and a second oxide layer and a metal layer on each of the second Si nanowires, where the second oxide layer on the second Si nanowires is thicker than the first oxide layer on the first Si nanowires.

In another aspect thereof the embodiments of this invention provide a structure that comprises a substrate and a first set of fins disposed on the substrate. The first set of fins comprises a first stack comprised of a first plurality of vertically stacked first Si nanowires that are spaced apart by a first distance. The structure further comprises a second set of fins disposed on the substrate comprised of a second plurality of vertically stacked second Si nanowires that are spaced apart by a second distance that is greater than the first distance, where in a given fin of the second set of fins there are fewer vertically stacked second Si nanowires than vertically stacked first Si nanowires in a given fin of the first set of fins. The first set of fins and the second set of fins have approximately the same total thickness. The structure further comprises a first oxide layer and a metal layer disposed on each of the first Si nanowires and a second oxide layer and a metal layer disposed on each of the second Si nanowires, where the second oxide layer disposed on the second Si nanowires is thicker than the first oxide layer disposed on the first Si nanowires, and where the first oxide layer is comprised of a layer of high dielectric constant metal oxide and where the second oxide layer is comprised of a layer of silicon oxide having an overlying layer of high dielectric constant metal oxide.

BRIEF DESCRIPTION OF THE SEVERAL VIEWS OF THE DRAWINGS

FIG. 1 shows a starting structure for a first embodiment of this invention (as well as for a second embodiment), where the starting structure includes a substrate having an overlying BOX layer and an initial SiGe layer;

FIG. 2 shows the structure of FIG. 1 after providing an isolation structure or region to separate what will be a thin gate dielectric region from what will be a thick gate dielectric region and after recessing the Si and SiGe layers in the thick gate dielectric region;

FIG. 3 shows the structure of FIG. 2 after epitaxial growth in the thick gate dielectric region of alternating Si layers and SiGe layers, where some of the SiGe layers are thicker than those in the thin gate dielectric region;

FIG. 4 shows the structure of FIG. 3 after forming a hard mask (HM) and patterning fins in the thin gate dielectric region and in the thick gate dielectric region;

FIG. 5A is an enlarged top view, not drawn to scale, showing the fins in the thin gate dielectric region of FIG. 4 disposed between opposed source/drain (S/D) landing pads or anchors;

FIG. 5B is another top enlarged view showing the opposed anchors and two top-most suspended NWs (formed in FIG. 6) in the thin gate dielectric region;

FIG. 6 shows the structure of FIG. 4 (and FIG. 5A) after removing the SiGe layers selective to the Si layers to form vertically stacked first NWs in the thin gate dielectric region and second NWs in the thick gate dielectric region;

FIG. 7 shows the structure of FIGS. 6 and 5B after performing a replacement gate front end of line process and depositing dielectric having a high dielectric constant (HK), a metal gate (MG) and poly-Silicon in the thin gate dielectric region;

FIG. 8 shows the structure of FIG. 7 after formation of a dielectric layer over the Si NWs in the thick gate dielectric region, followed by deposition of HK, MG layers and poly-Silicon; and FIG. 9 shows the structure of FIG. 8 after removing the poly-Silicon and depositing a gate metal fill in the thin gate dielectric region and in the thick gate dielectric region.

FIG. 10 shows, for a second embodiment of this invention, the starting structure (as in FIG. 1) after forming the isolation structure and then implanting Ge in what will be the thick gate dielectric region to form implant peaks in certain ones of the Si layers to convert them to SiGe layers, and the performance of a solid-phase epitaxy or solid-phase crystallization (SPE/SPC) operation; and FIG. 11 shows the structure of FIG. 10, prior to continuing to perform the operations of FIGS. 4-9, after the implant and SPE or SPC operations are concluded and illustrates in the thick gate dielectric region the thicker layers of SiGe each containing one of the converted SiGe layers.

FIG. 12 shows, for a third embodiment of this invention, a starting structure that is a result of the multi-layer deposition as in FIG. 1, but modified so as to include thin layers of Ge that are adjacent to a top and a bottom of certain Si layers;

FIG. 13 shows the structure of FIG. 12 after providing the isolation structure to separate what will be the thin gate dielectric region from what will be the thick gate dielectric region;

FIG. 14 shows the structure of FIG. 13 after patterning fins;

FIG. 15 shows the structure of FIG. 14 after applying a first block mask in the thick gate dielectric region and then removing in the thin gate dielectric region the SiGe layers and the Ge layers selective to the Si layers to create vertically stacked Si NWs in the thin gate dielectric region;

FIG. 16 shows the structure of FIG. 15 after removing the first block mask and applying a second block mask to cover the Si NWs in the thin gate dielectric region, and performing an anneal to cause a Si/Ge intermix and thereby form SiGe from a pair of Ge layers and the interposed Si layer;

FIG. 17 shows the structure of FIG. 16 at the completion of the thermal intermix process and illustrates that there are resultant SiGe layers disposed between already present SiGe layers, while those Si layers that were not in direct contact with a Ge layer remain intact; and FIG. 18 shows the structure of FIG. 17, prior to continuing to perform the operations of FIGS. 7-9, after an etch process to remove the layers of SiGe selective to the Si layers thereby creating stacked Si NWs in the thick gate dielectric region.

DETAILED DESCRIPTION

Figure 1:
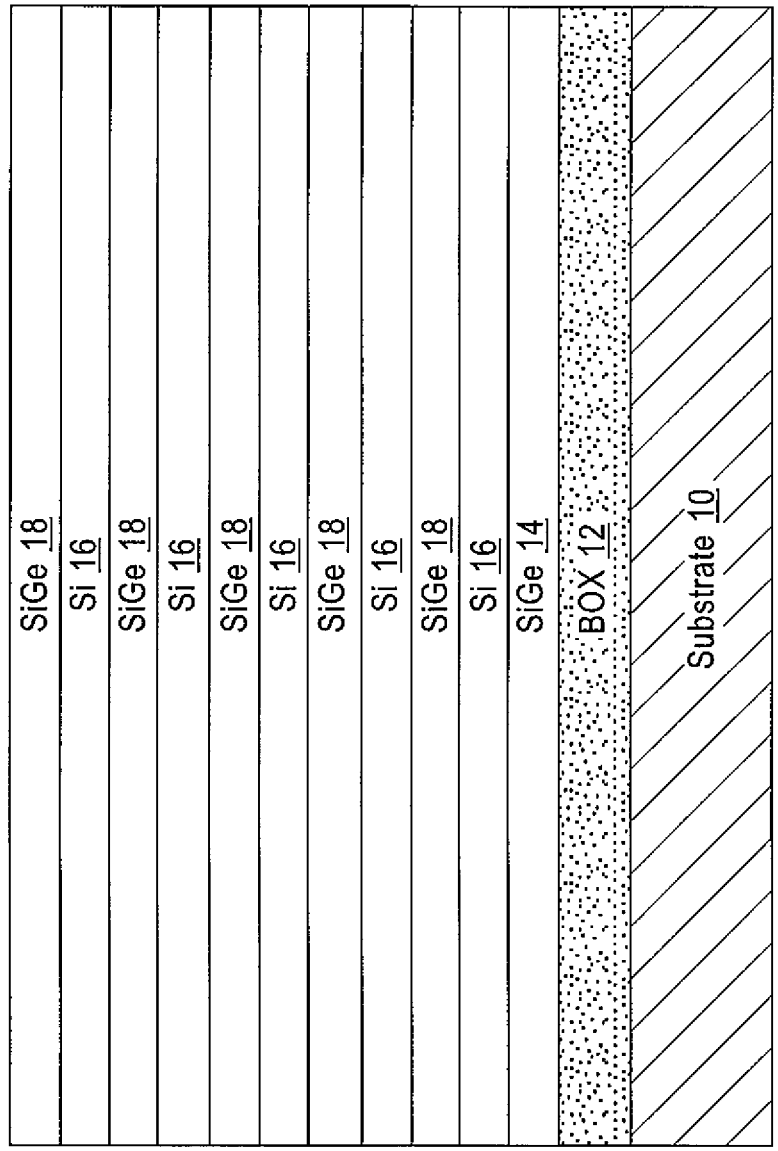
FIGS. 1-18, with the exception of FIGS. 5A and 5B (collectively referred to as FIG. 5), are each an enlarged cross-sectional view showing various initial, intermediate and completed or substantially completed structures that are fabricated in accordance with embodiments of this invention, wherein the various layer thicknesses and other dimensions are not necessarily drawn to scale. More specifically.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses and methods that are suitable for use in implementing the embodiments of this invention can include, but are not limited to, chemical vapor deposition (CVD) such as, for example, rapid thermal chemical vapor deposition (RTCVD), atmospheric pressure chemical vapor deposition (APCVD), low pressure chemical vapor deposition (LPCVD) and ultra-high vacuum chemical vapor deposition (UHVCVD). Other suitable epitaxial growth processes can include, but are not limited to, molecular beam epitaxy (MBE) and low-energy plasma deposition (LEPD). The temperature for an epitaxial deposition process typically ranges from about 300° C. to about 900° C. Although higher temperature will typically result in faster deposition of the semiconductor material, the faster deposition may also result in crystal defects and film cracking.

In at least one embodiment thereof this invention can employ semiconductor on insulator (SOI) technology where a thin semiconductor layer, such as a layer of SiGe or a layer of Si, is formed over an insulating layer, such as silicon oxide, which in turn is formed over a (bulk) substrate, such as a Si substrate. The insulating layer can be referred to as a buried oxide (BOX) layer or simply as a BOX. For a single BOX SOI wafer the SOI layer can be divided into active regions by shallow trench isolation (STI) which intersects the BOX and provides total isolation for active device regions formed in the SOI layer. For FinFET devices fin structures can be defined in the SOI layer and sources and drains can be formed, for example, by ion implantation of N-type or P-type dopants into the fins. A FET channel region between a source/drain pair can be created so as to underlie a gate structure.

It is pointed out that while certain aspects and embodiments of this invention can be employed with SOI substrates, including extremely thin SOI (ETSOI) substrates, the invention can also be realized using bulk (e.g., Si) substrates.

In the case of a stacked NW FinFET channel it can be desirable to leave a top-most NW intact as this can be beneficial for topography considerations and for various lithography and reactive ion etch (RIE) processes. In order to maximize the density of the NWs and reduce parasitics, a minimal spacing between NWs is required. The minimal spacing is determined in large part by HK/MG (high dielectric constant insulator/metal gate) thickness and work-function definition. The minimal spacing can be, for example about 10 nm. However, certain transistor applications, such as input/output (I/O) devices, require a relatively thick gate dielectric, e.g., about 3.5 nm-4 nm, in addition to the thickness of the HK dielectric (e.g., about 2 nm), as well as the work-function MG. As a result an increased spacing (gap) between NWs is needed to accommodate the thicker dielectric.

The embodiments of this invention address this need to integrate NWs with a larger gap (such as for accommodating a thicker oxide for I/O circuitry) and NWs with a smaller gap (e.g., for logic and memory, e.g., static RAM, circuitry) on a common substrate. This ability to integrate the large gap and small gap NWs on a common substrate is beneficial for a number of applications of interest including, for example, system on a chip (SoC) applications where there are a mixture of various circuits and circuit types (e.g., logic, memory, I/O) on a single common substrate. Described below are three exemplary embodiments of this invention that achieve this valuable goal.

FIG. 1 shows a starting structure for a first embodiment. The starting structure includes a substrate (e.g., a Si substrate) 10 having an overlying BOX layer 12 and an initial layer 14 of $Si_{1-x}Ge_x$, where x can be in a range of about 0.1 to about 0.35, with 0.2 being one suitable nominal value. This can be considered as a SGOI (SiGe on insulator) substrate, although in other embodiments the layer 14 of SiGe could be formed directly on the substrate 10. On the initial layer 14 of $Si_{1-x}Ge_x$, there are formed by successive blanket deposition steps alternating layers of Si 16 and $Si_{1-x}Ge_x$, 18 (x equal to, for example, also about 0.2). In this embodiment there are five layer pairs formed from five layers of Si 16 and five layers of $Si_{1-x}Ge_x$, although there could fewer than five layers of each (e.g., three layers of each) or more than five layers of each. Each of the layers 14, 16 and 18 has a same nominal thickness of, for example, about 8 nm to about 10 nm.

Figure 2:
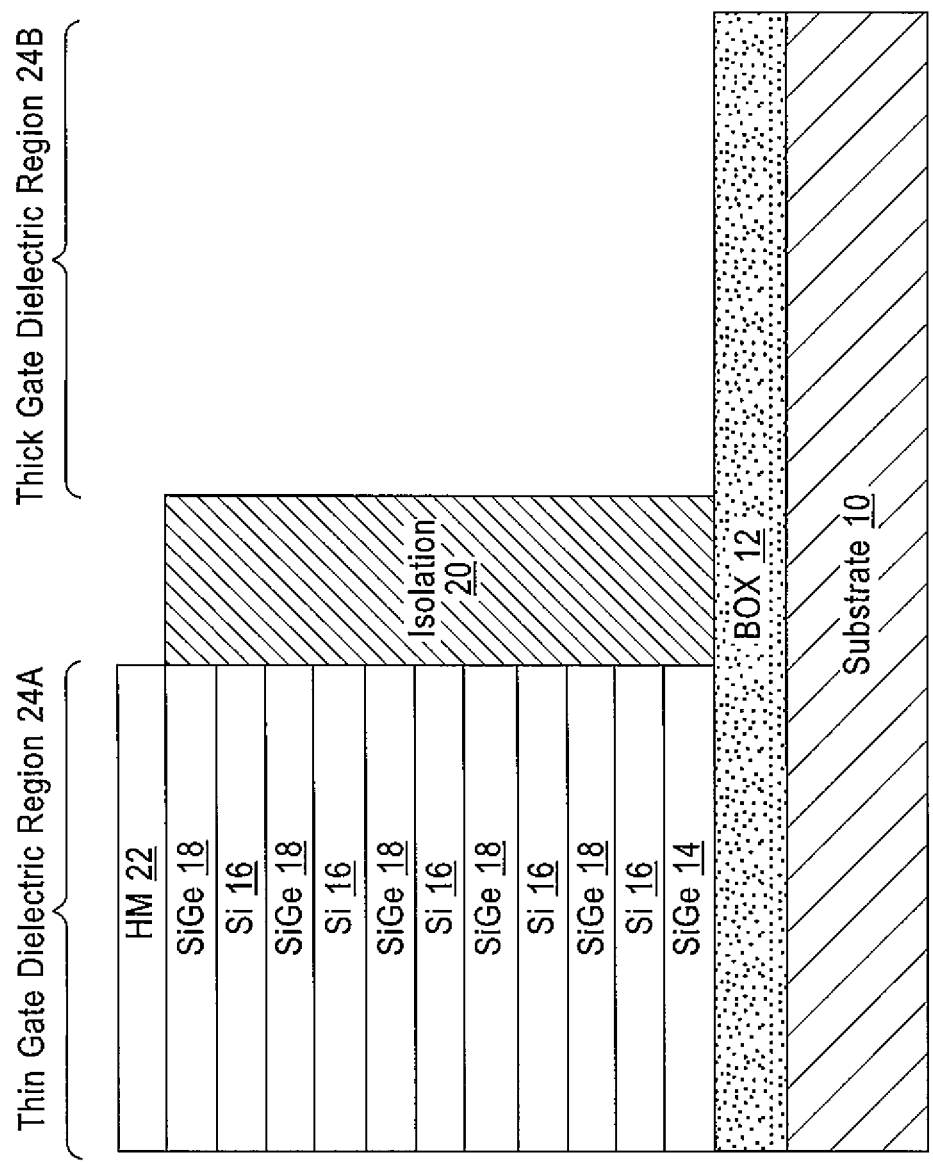

FIG. 2 shows the structure of FIG. 1 after providing an isolation 20, e.g., a shallow trench isolation (STI) structure such as an oxide, to separate a thin gate dielectric region 24A (e.g., what will be a logic or SRAM circuitry region) from a thick gate dielectric region 24B (e.g., what will be an I/O circuitry region or some other region (e.g., analog circuitry) needing a thicker gate oxide). The isolation extends to the surface of the BOX 12. In this step a hard mask (HM) 22, e.g., a nitride, is formed on the thin gate dielectric region 24A and the Si and SiGe layers 16 and 18 in the thick gate dielectric region 24B are then recessed using a RIE process selective to the initial SiGe layer 14.

It is noted at the outset that in what is referred to herein as the thin gate dielectric region 24A the resulting finFET devices will comprise Si NWs having a coating comprised of a layer of dielectric having a high dielectric constant (HK), while in what is referred to herein as the thick gate dielectric region 24B the resulting finFET devices will comprise Si NWs having a coating comprised of a layer of a second dielectric, for example $SiO_2$, having an overlying layer of a HK, where the combined thickness of the layer of the second dielectric and the layer of a HK dielectric in the thick gate dielectric region 24B is greater than (thicker than) the thickness of the layer of HK dielectric in the thin gate dielectric region 24A. An aspect of this invention is to provide methods to form NW stacks on a common substrate that can accommodate both thin and thick gate dielectrics.

Figure 3:
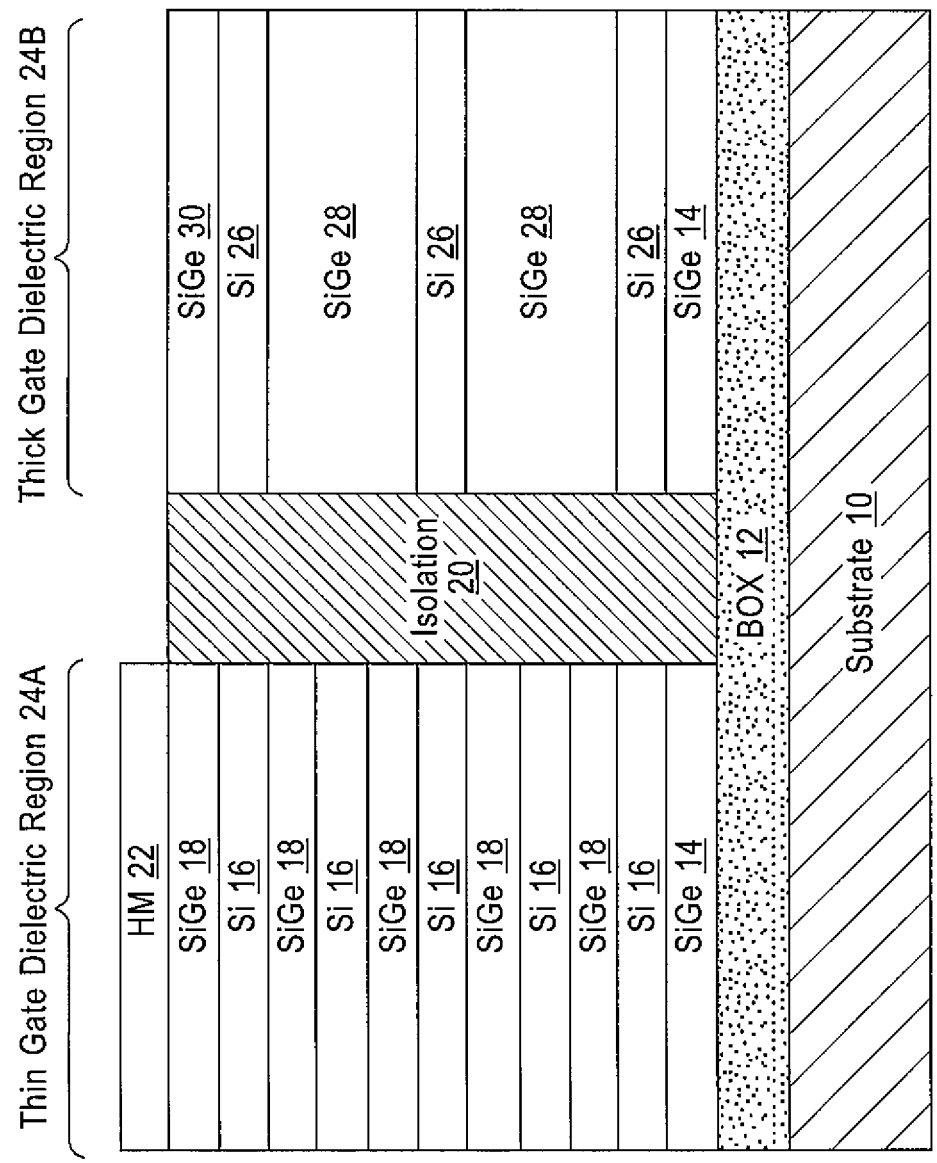

FIG. 3 shows the structure of FIG. 2 after epitaxial growth in the thick gate dielectric region 24B of alternating Si layers 26 and SiGe layers 28. The Si layers 26 have the same thickness as the Si layers 16 in the thin gate dielectric region 24A, e.g., about 8 nm to about 10 nm, while the SiGe layers 28 are thicker, e.g., about three times thicker than the Si layer 16 or, in the embodiment being described, in a range of about 24 nm to about 30 nm depending on the thickness of the Si layers 16 and 26. As such, each of the Si layers 26 lines up with a corresponding Si layer 16 in the thin gate dielectric region 24A. A final thinner SiGe layer 30 (e.g., about 8 nm to about 10 nm) is grown at the top of the layer stack so that the height of the layer stack in the thick gate dielectric region 24B is approximately equal to the height of the layer stack in the thin gate dielectric region 24A. As a result subsequent fin formation will yield sets of fins having about the same height, a feature that can be desirable in order to maintain a uniform surface topography and for other reasons.

Alternatively, to achieve the structure shown in FIG. 3 the isolation 20 between the thin gate dielectric region 24A and the thick gate dielectric region 24B could be a spatial isolation. In this case the BOX 12, or the SiGe layer 14 if present, in what will be the thick gate dielectric region 24B can be masked during epitaxial growth of the layers 16, 18 in the thin gate dielectric region 24A. The mask can then be removed followed by epitaxial growth of the layers 26 and 28 in the thick gate dielectric region 24B. This procedure avoids a need to recess the Si and SiGe layers 16 and 18 in the thick gate dielectric region 24B as in FIG. 2.

Figure 4:
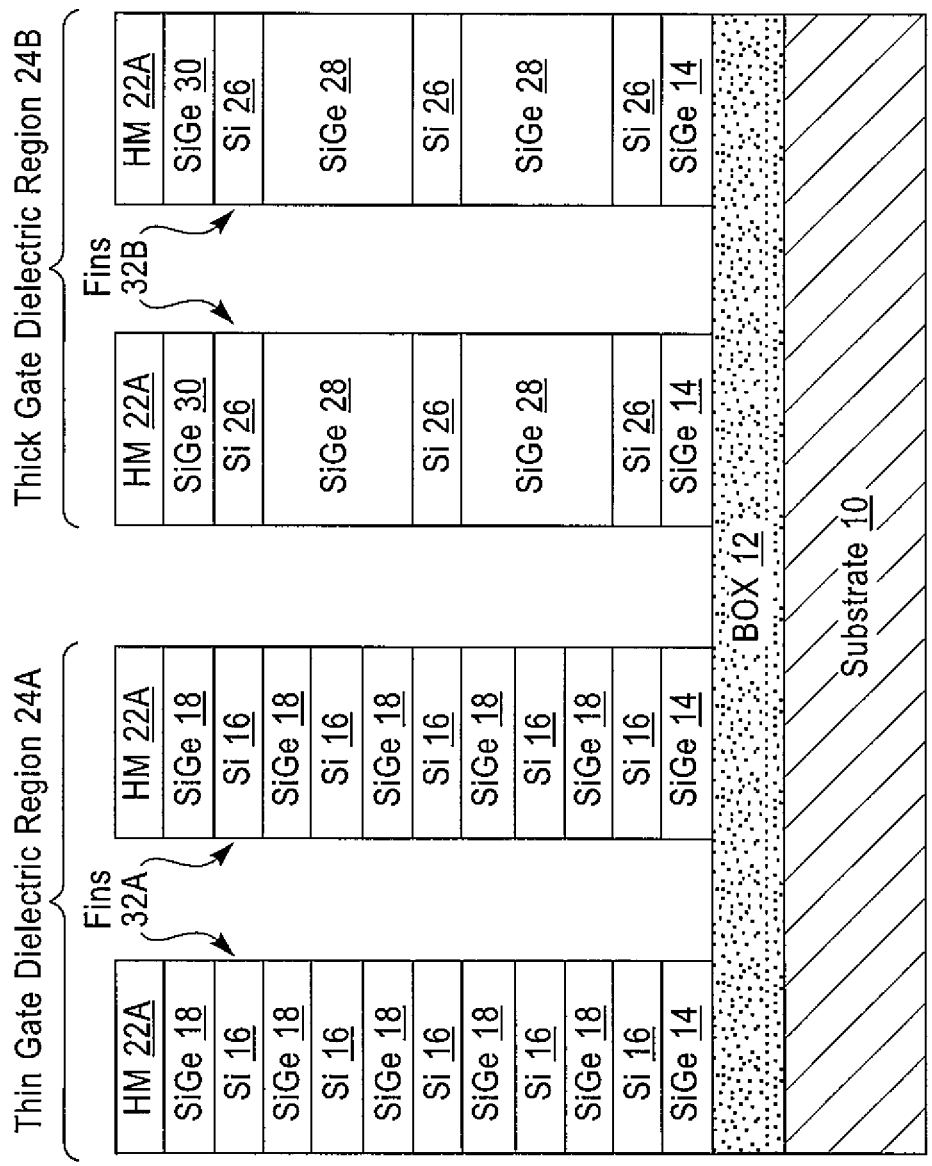

FIG. 4 shows the structure of FIG. 3 after forming a HM 22A and patterning fins using lithography or sidewall image transfer and RIE. In the illustrated example two fins 32A are formed in the thin gate dielectric region 24A and two fins 32B are formed in the thick gate dielectric region 24B. More than two fins can be formed. The spacing between fins in each region (fin pitch, center-to-center) could be, for example, in a range of about 25 nm to about 40 nm. The fin width could be in an exemplary range of about 4 nm to about 10 nm, with 7 nm being one suitable nominal value. The fin height is a function of the thickness of the initial layer 14 of $Si_{1-x}Ge_x$ and the thicknesses of the layers 16 and 18 in the thin gate dielectric region 24A and the layers 26 and 28 in the thick gate dielectric region 24B. The fin length, into the drawing page, can be any desired value.

Figure 5:
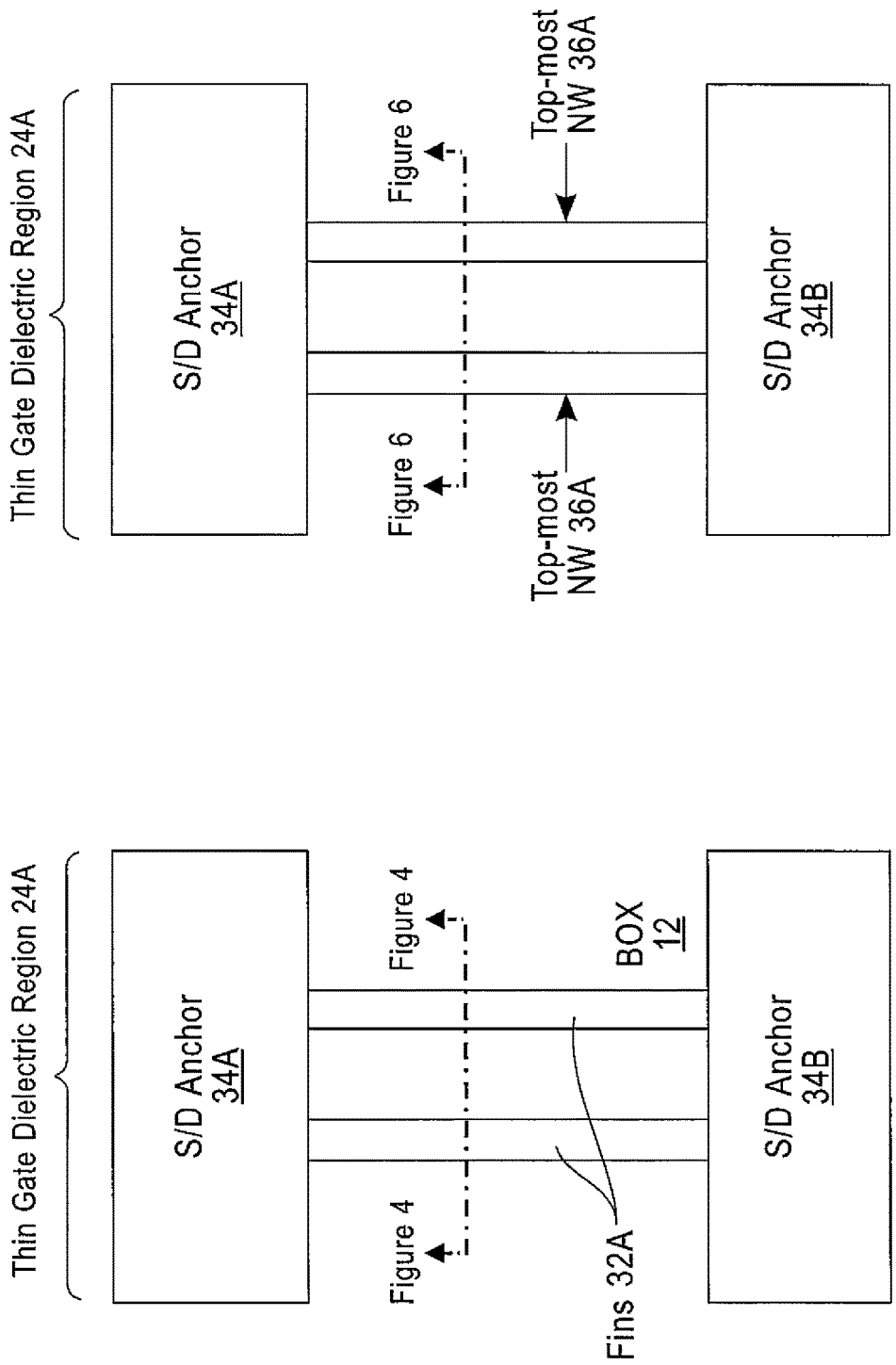

For clarification, FIG. 5A is a top view showing the two fins 32A in the thin gate dielectric region 24A in the view of FIG. 4. Each fin 32A is disposed on the top surface of the BOX 12 and between opposed source/drain (S/D) landing pads or anchors or anchor pads 34A and 34B. The structure that will form the anchors 34A and 34B is formed during the deposition of the various layers shown in FIG. 1, and in this embodiment each anchor includes the full complement of layers shown in FIG. 1 and each layer is continuous from anchor 34A, through the fins 32A and into the anchor 34B. It can appreciated that the view of FIG. 4 is a cross-section through what will be the GAA NW channel of a finFET still to be fabricated in FIGS. 6-9. A top view of the fins 32B in the thick gate dielectric region 24B would have a similar appearance, although the fin length could vary from the fin length in the thin gate dielectric region 24A.

Figure 6:
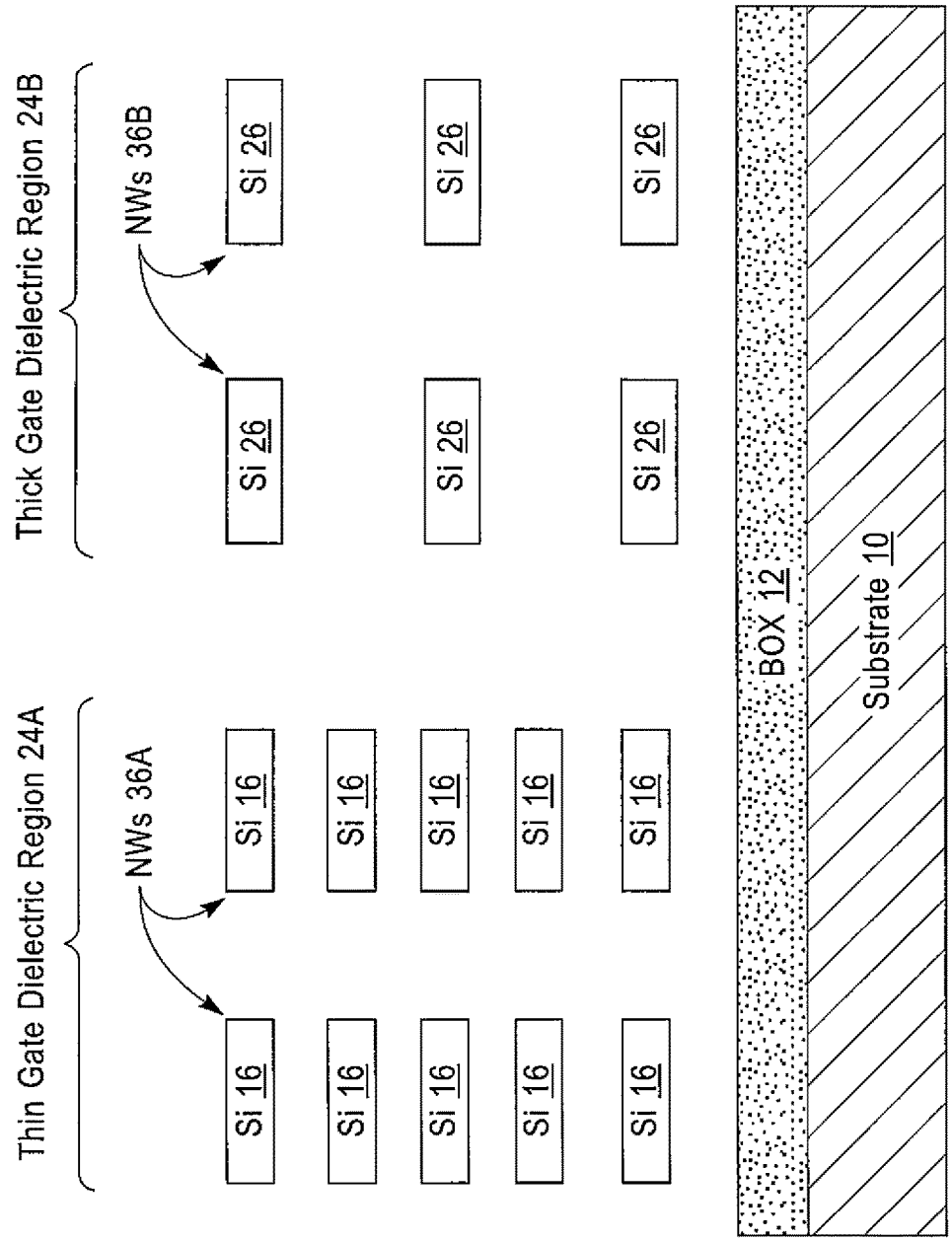

FIG. 6 shows the structure of FIG. 4 (and FIG. 5A) after removing the HM 22A and the SiGe layers 18, 28 and 30 selective to the Si layers 16 and 26.

It can be noted that the during the performance of this step a block mask would typically not be needed to protect the source and drain anchor pads 34A and 34B because the NWs are much narrower than the anchor pads. When the selective etch of the SiGe layers 18 is performed the NW becomes suspended when all the SiGe in that region is etched, but at that time there is still a significant portion of the SiGe remaining in the anchor pad region due to the much larger width of the anchor pad. For example, a NW of 10 nm width requires 5 nm of SiGe etch from each side to remove the entire adjacent top and bottom SiGe to suspend the NW completely. However, the same 5 nm of SiGe etch on a, for example, 500 nm wide anchor pad will still leave 490 nm of SiGe in the width of the anchor pad. The removal of 10 nm from the anchor pad could be considered to be inconsequential to the functionality of the overall circuit being fabricated.

A chemical vapor etch process can be used for selectively etching the SiGe layers 18, 28 and 30 selective to the Si layers 16 in a temperature range of about 600° C. to about 800° C. using $H_2$/HCl. The result is the creation of NWs 36A in the thin gate dielectric region 24A and NWs 36B in the thick gate dielectric region 24B. The NWs 36A are suspended and stacked vertically above the BOX 12 between the anchors 34A and 34B. The same applies to the NWs 36B and their respective anchors (not shown).

For clarity purposes the NWs 36A and 36B are shown in FIG. 6 to have an exaggerated rectangular cross-sectional shape. However, in some embodiments the NWs could have a substantially square cross-sectional shape for a case where the thickness of the Si layers 16 and 26 is substantially equal to the fin width (e.g., 8 nm by 8 nm, or 10 nm by 10 nm). In any case, the resulting horizontally suspended structures, whether considered as "nanowires" or as "nanoribbons" or as "nanosheets", or referenced by some other name, are elongated nanometer-scale semiconductor (e.g., Si) electrical conductors capable of functioning, in the preferred but non-limiting embodiments, as part of a channel in a GAA finFET. As such, all subsequent references herein to "nanowires" or "NWs" are made without specific regard to the actual cross-sectional shape of the constituent semiconductor electrical conductors.

FIG. 5B is a top view showing the two top-most suspended NWs 36A (relative to the top surface of the BOX 12) in the thin gate dielectric region 24A of FIG. 6. A top view of the NWs 36B in the thick gate dielectric region 24B would have a similar appearance, although as before the NW length could vary from the NW length in the thin gate dielectric region 24A.

Figure 7:
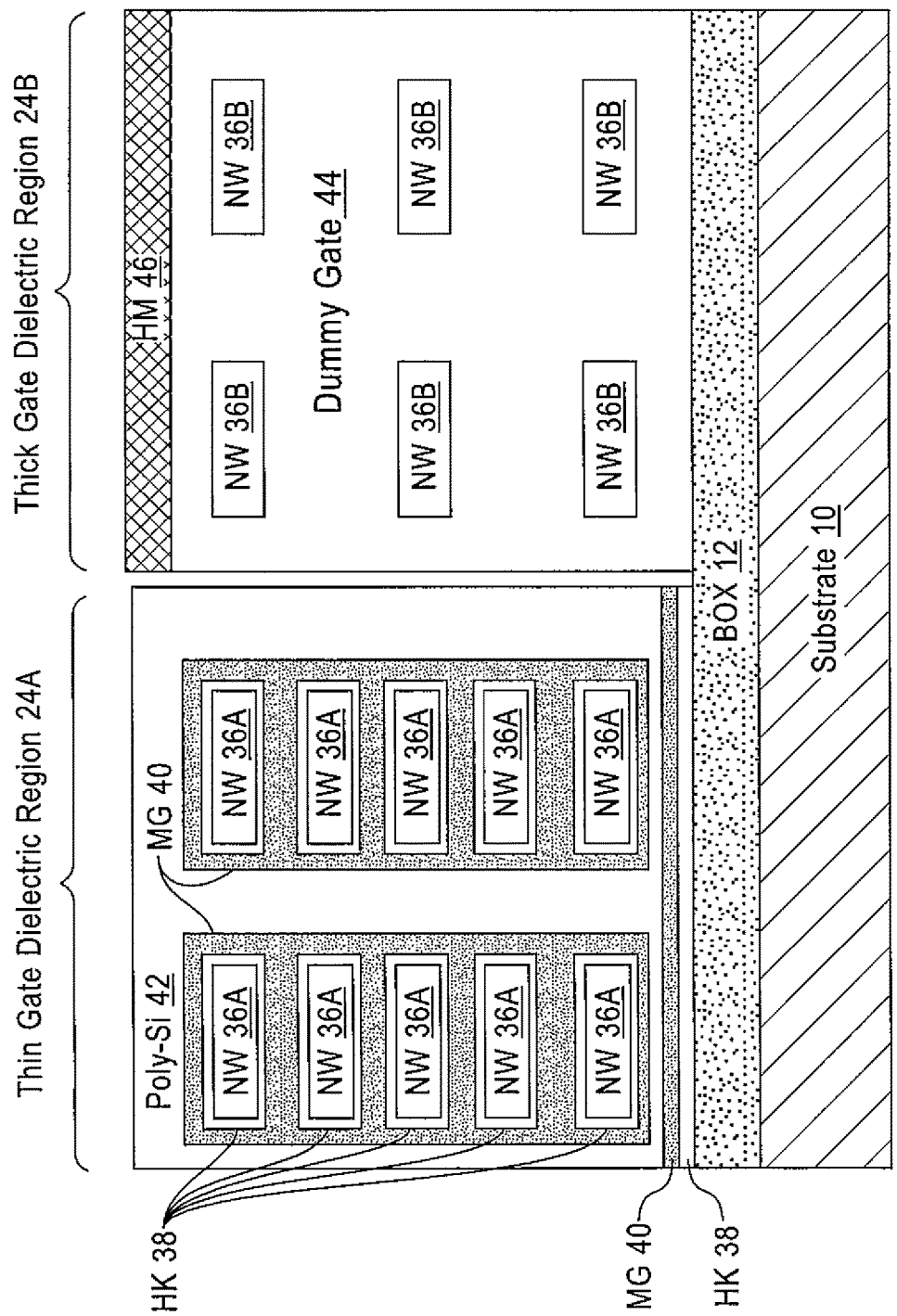

FIG. 7 shows the structure of FIGS. 6 and 5B after performing a conventional replacement gate front end of line (FEOL) process. This process results in forming dummy gates in both the thin gate dielectric region 24A and the thick gate dielectric region 24B. Gates spacers are formed (not shown) adjacent to the dummy gate 44. A HM 46 is formed over the dummy gate 44 (e.g., poly-Si) in the thick gate dielectric region 24B, followed by source/drain doping and inter-layer dielectric (ILD) formation in the thin gate dielectric region 24A. The dummy gate is removed from the thin gate dielectric region 24A and a multi-step deposition process is performed to deposit a HK layer 38 and a MG layer 40. Then poly-Si 42 is deposited in the thin gate dielectric region 24A to protect the thin gate dielectric region during processing of the thick gate dielectric region 24B.

It is pointed out that poly-Si deposition would not normally be done at this point, instead a metal gate fill would be applied followed by a chemical mechanical polish (CMP). However, since the thick gate dielectric region 24B is to be processed next, and the metal gate fill and CMP operations should preferably only be performed once, the poly-Si 42 is applied to the thin gate dielectric region 24A to protect it. Then, once the thick gate dielectric region replacement metal gate (RMG) process is performed, the method can remove the poly-Si from both the thick and thin gate dielectric regions (simultaneously) followed by the simultaneous metal fill and CMP.

In general, a dummy (sacrificial) gate or placeholder can removed by a dry etch or wet etch process. In one embodiment, the gate placeholder can be comprised of polycrystalline Si or amorphous Si and is removed with a dry etch process comprising $SF_6$. In another embodiment gate placeholder can be comprised of polycrystalline Si or amorphous silicon and can be removed with a wet etch process comprising aqueous $NH_4OH$ or tetramethylammonium hydroxide (TMAH). In another embodiment, the gate placeholder can be comprised of silicon dioxide and removed with a wet etch comprising aqueous hydrofluoric acid, ammonium fluoride or both. In another embodiment, the gate placeholder is comprised of silicon nitride and can be removed with a wet etch comprising aqueous phosphoric acid.

As non-limiting examples, the processing of FIG. 7 can be achieved by gate dielectric deposition and gate metal deposition on the NWs 36A. For example, the gate dielectric can be formed as a layer of high dielectric constant (high-k or HK) material (HK 38) comprising a dielectric metal oxide and having a dielectric constant that is greater than the dielectric constant of silicon nitride (7.5). The high-k dielectric layer may be formed by methods known in the art including, for example, chemical vapor deposition (CVD), atomic layer deposition (ALD), molecular beam deposition (MBD), pulsed laser deposition (PLD) and liquid source misted chemical deposition (LSMCD), etc. The dielectric metal oxide comprises a metal and oxygen, and optionally nitrogen and/or silicon. Exemplary high-k dielectric materials include $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently established from about 0.5 to about 3.0 and each value of y is independently established from about 0 to about 2.0. The thickness of the high-k dielectric layer 38 may be from about 1 nm to about 10 nm, and more preferably from about 1.5 nm to about 3 nm. The high-k dielectric layer can have an effective oxide thickness (EOT) on the order of, or less than, about 1 nm.

The metal gate (MG) layer 40 can be deposited directly on the surface of the high-k dielectric layer 38 by, for example, chemical vapor deposition (CVD), physical vapor deposition (PVD), or atomic layer deposition (ALD). As non-limiting examples the metal gate layer 40 can include a metal system selected from one or more of TiN, TiC, TiAlC, TaN, TaC, TaAlC, TaSiN, HfN, W, Al and Ru, and may be selected at least in part based on the desired work function (WF) of the device (nFET or pFET), as is known. A typical thickness for the MG layer 40 could be in a range of about 0.5 nm to about 5 nm, with about 2 nm being one suitable nominal value.

Figure 8:
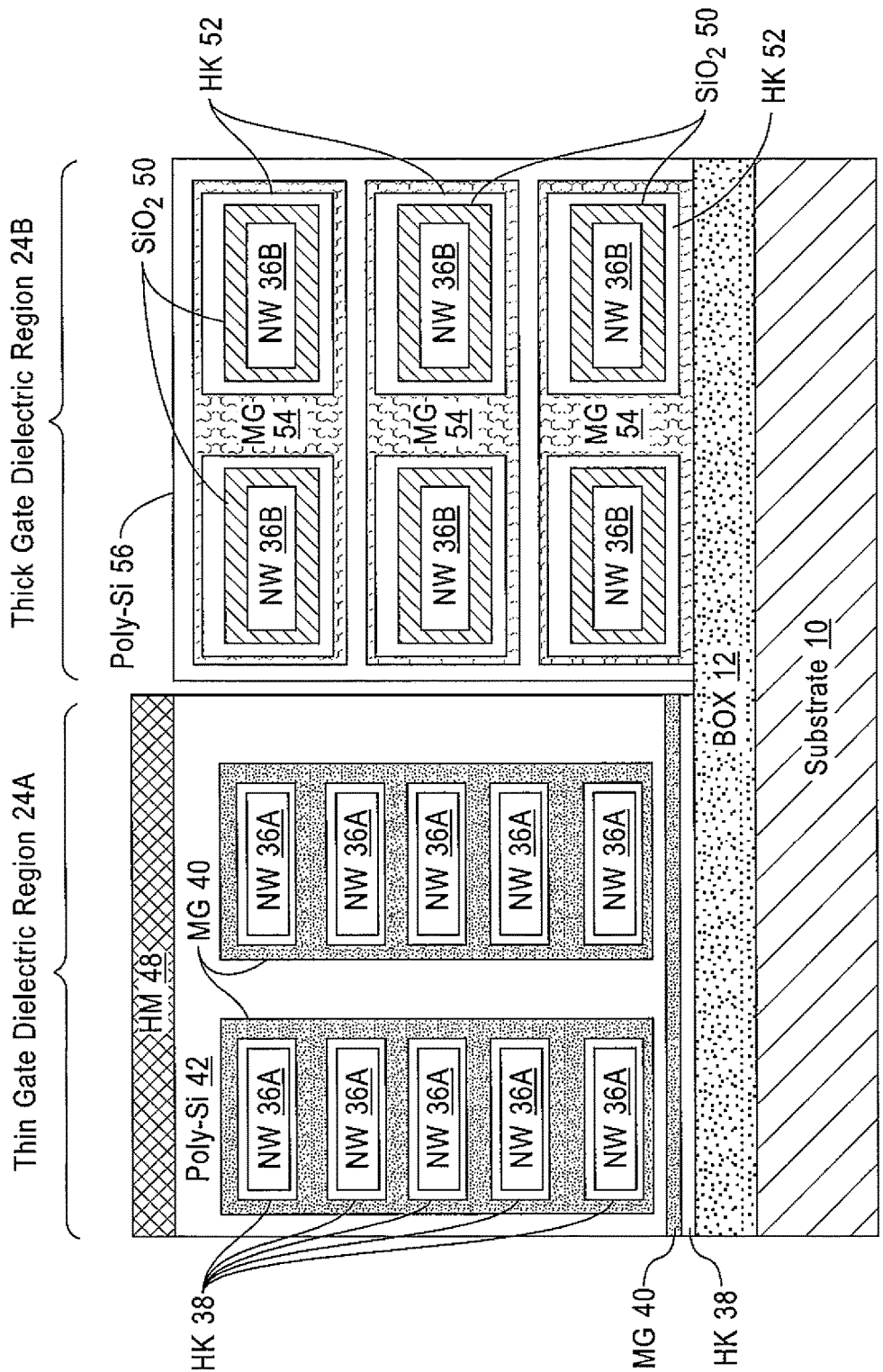

FIG. 8 shows the structure of FIG. 7 after applying a HM 48 over the poly-Si 42 in the thin gate dielectric region 24A, removal of the HM 46 and the dummy gate 44 in the thick gate dielectric region 24B, and the deposition or the growth of a dielectric layer 50 (e.g., $SiO_2$) over the Si NWs 36B. The dielectric layer 50 is provided for those devices (e.g., I/O transistors) that require the thicker dielectric than the, e.g., logic and/or SRAM, transistors in the thin gate dielectric region 24A. The embodiments of this invention thus provide greater spacing between the Si NWs 36B to accommodate the thickness of the additional layer of dielectric 50 that is not present on the NWs 36A in the thin gate dielectric region 24A. The thickness of the $SiO_2$ layer 50 can be, as a non-limiting example, in a range of about 3.0 nm to about 4 nm.

Processing continues to deposit, by a multi-step deposition process, a HK layer 52 on the $SiO_2$ layer 50, a MG layer 54 over the HK layers 52 on laterally adjacent NWs 36B, and poly-Si 56 in the thick gate dielectric region 24B. It can be noted in this embodiment that during these deposition steps a layer of HK material (not shown) can be formed on the surface of the BOX 12 and the MG layer 54 can be formed on this HK layer. A layer of poly-Si 56 (dummy gate) can then be applied over the coated NW structures.

It can be noted that in FIG. 7 the MG 40 extends vertically between adjacent NWs 36A, while in FIG. 8 the MG 54 extends horizontally between adjacent NWs 36B. This difference is related to the spacing between NWs. For the thin gate dielectric case of FIG. 7 there is a smaller distance in the vertical direction which causes the MG 40 to merge between the vertically adjacent NWs 36A. However, for the thick gate dielectric case of FIG. 8 there is a larger distance between the NWs 36B in the vertical direction. For the horizontal direction the spacing between NWs is the same for both cases, but in the thick gate dielectric region 24B the $SiO_2$ takes up space, which then causes the MG 54 to merge in the horizontal direction.

Figure 9:
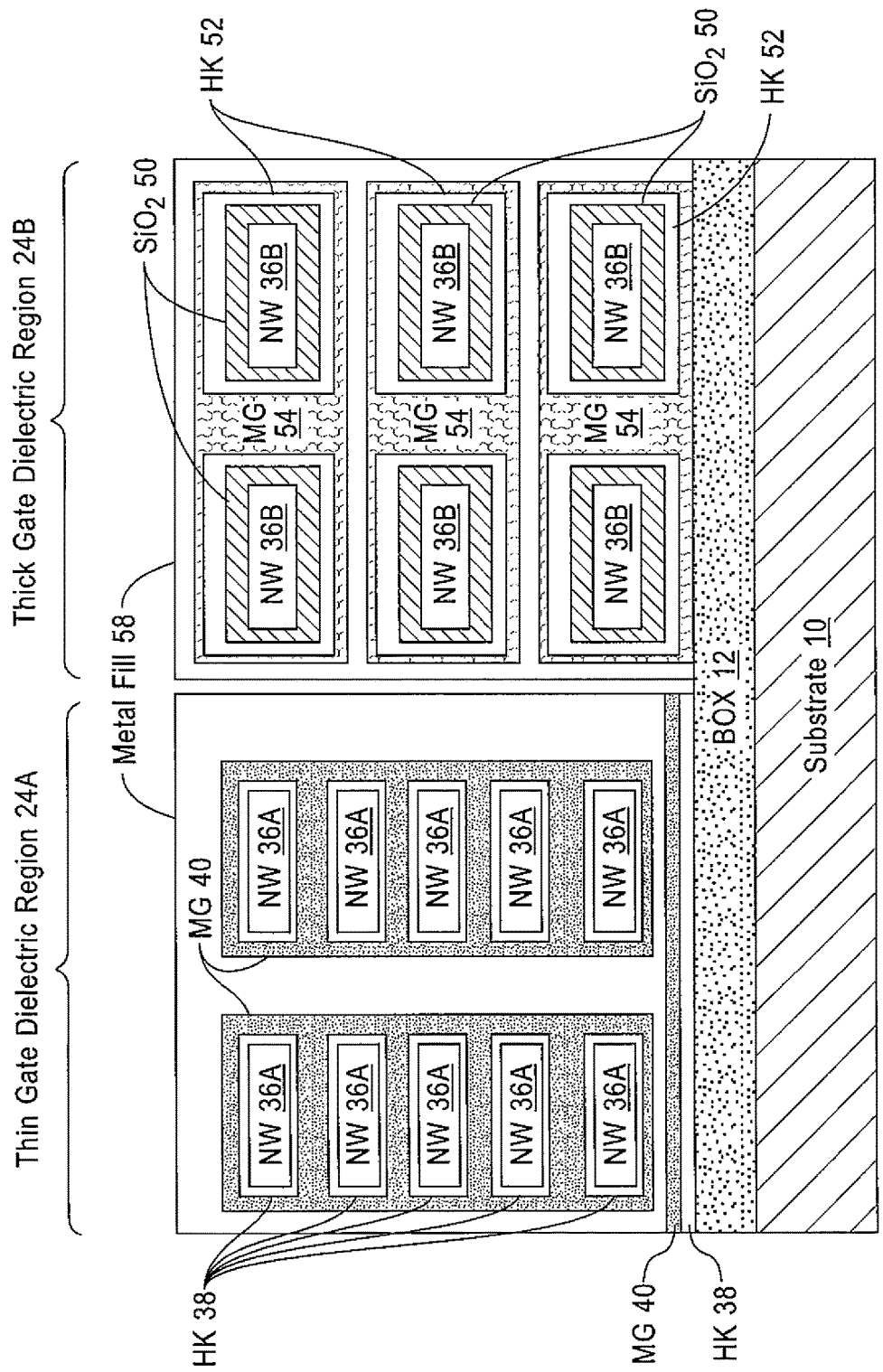

FIG. 9 shows the structure of FIG. 8 after removing the HM 48, performing an (optional) HK reliability anneal, removing the poly-Si 42 and 56 and depositing a gate metal fill 58 (e.g., depositing Tungsten as one suitable gate metal) in both the thin gate dielectric region 24A and the thick gate dielectric region 24B. Preferably the metal fill operation uses the same metal in both regions and both regions have the gate metal fill applied simultaneously. Processing then continues in a conventional fashion (e.g., to perform any remaining FEOL and back end of line (BEOL) operations). If performed the HK reliability anneal can be a gas anneal conducted in a temperature range of about 500° C. to about 900° C.

It can be noted that the device in the thick gate dielectric region 24B has a fewer number of nanowires than the device in the thin gate dielectric region 24A. However, the GAA architecture enables scaling the gate length, i.e., reducing the gate length in the thick gate dielectric region 24B, to compensate for the reduced number of NWs. This can result in a comparable drive current between the devices in the thin gate dielectric region 24A and the devices in the thick gate dielectric region 24B.

The second embodiment of this invention will now be described. An initial starting structure can be the same as that shown in FIG. 1 for the first embodiment, and the Si layers 16 and the SiGe layers 18 can have the same thicknesses and compositions, i.e., on the initial layer 14 of $Si_{1-x}Ge_x$, there are formed by successive blanket deposition steps the alternating layers of Si 16 and $Si_{1-x}Ge_x$, 18 (x equal to, for example, about 0.2). As in FIG. 1, each of the layers 14, 16 and 18 can have the same nominal thickness of, for example, about 8 nm to about 10 nm.

Figure 10:
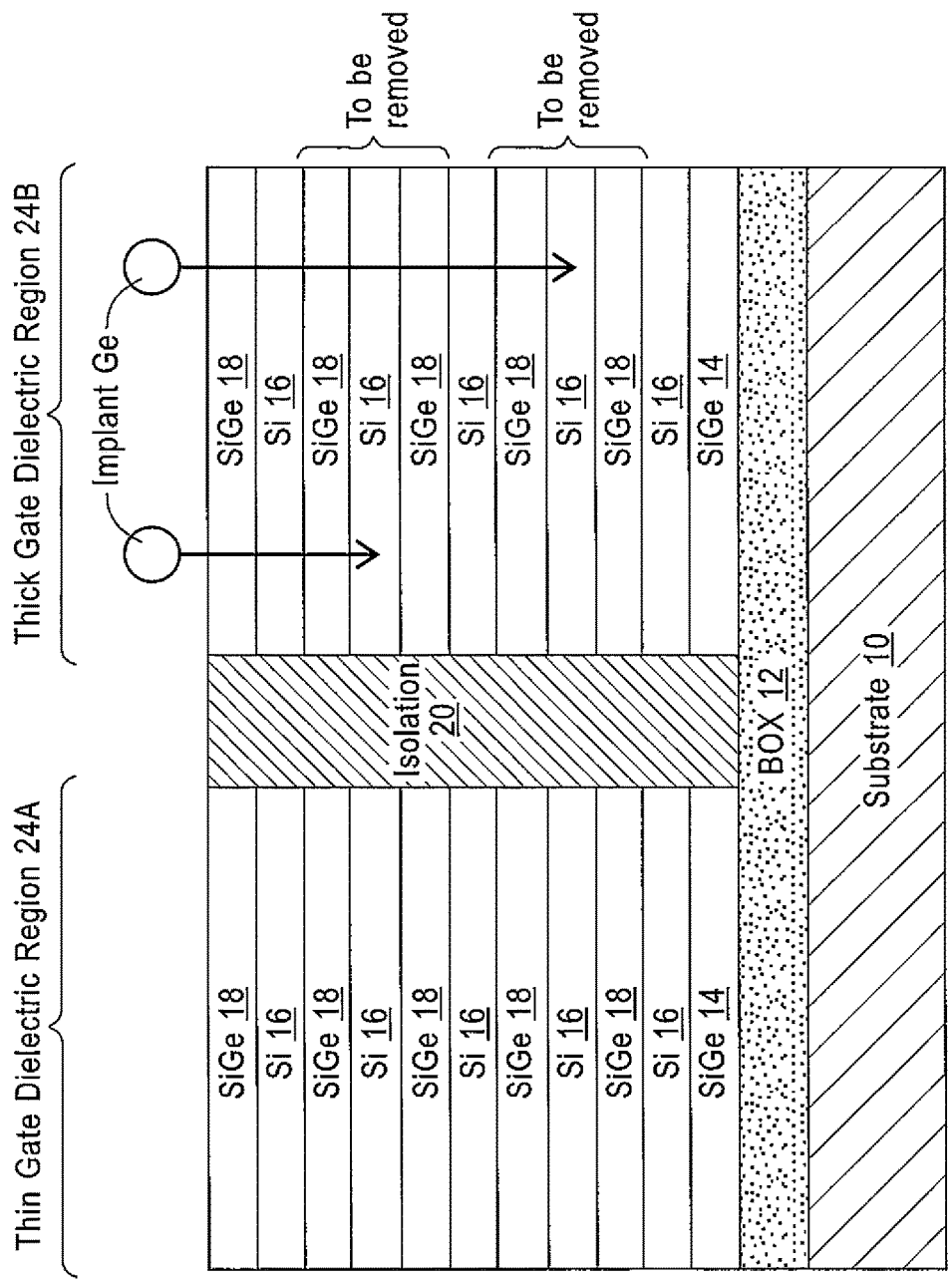

FIG. 10 shows the starting structure (as in FIG. 1) after forming the isolation 20 (e.g., STI). In this case the isolation 20 separates the Si layers 16 and the SiGe layers 14, 18 into the thin gate dielectric region 24A and into the thick gate dielectric region 24B, and extends through all of the layers to the BOX 12. Next an ion implant is performed using Ge as the implant species in this embodiment. The implant can be performed either at room-temperature or at an elevated temperature and is configured to target certain Si layers to be subsequently removed to achieve the wider spacing between certain Si NWs. In the illustrated embodiment the implant operation is performed by adjusting the implant energy so as to form two distinct implant peaks, one in the fourth Si 16 layer counting upwards from the surface of the BOX 12 and one in the eighth Si 16 layer counting upwards from the surface of the BOX 12. The implanted Si layers, now converted to the SiGe layers 18A shown in FIG. 11, each lie between two SiGe layers that will be removed. Following the implant operation a low-temperature (e.g., less than about 700° C.) solid-phase epitaxy or solid-phase crystallization (SPE/SPC) operation is performed to heal implant-induced damage while causing minimal Ge/Si inter-diffusion.

Figure 11:
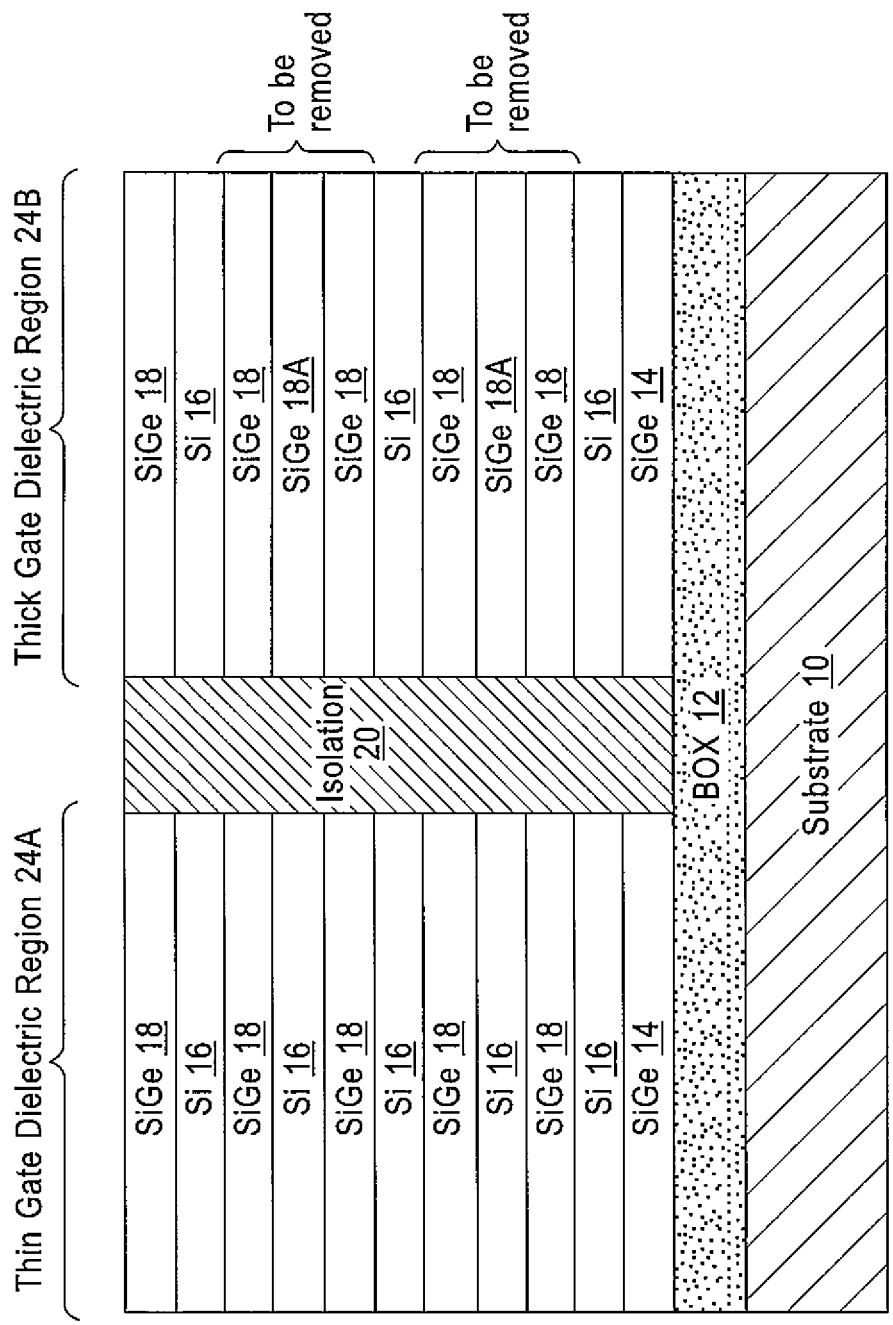

FIG. 11 shows the structure of FIG. 10 after the implant and SPE or SPC operations are concluded. As can be seen, and comparing FIG. 11 with FIG. 3, there are now two thicker layers (e.g., 30 nm in this example) of SiGe each containing one of the converted SiGe layers 18A and the two adjacent SiGe layers 18. These two thicker SiGe layers are separated by a layer of Si 16 and are functionally equivalent to the two thicker SiGe layers 28, separated by the Si layer 26, shown in the embodiment of FIG. 3.

At this point processing can continue as was described above for FIGS. 4-9 to perform the fin definition, SiGe removal, HK, MG and thick gate dielectric deposition (in the thick gate dielectric region 24B), dummy gate formation and removal, and metal fill steps. The end result is the formation of the first set of NW finFETs in the thin gate dielectric region 24A and the second set of NW finFETs in the thick gate dielectric region 24B.

Figure 12:
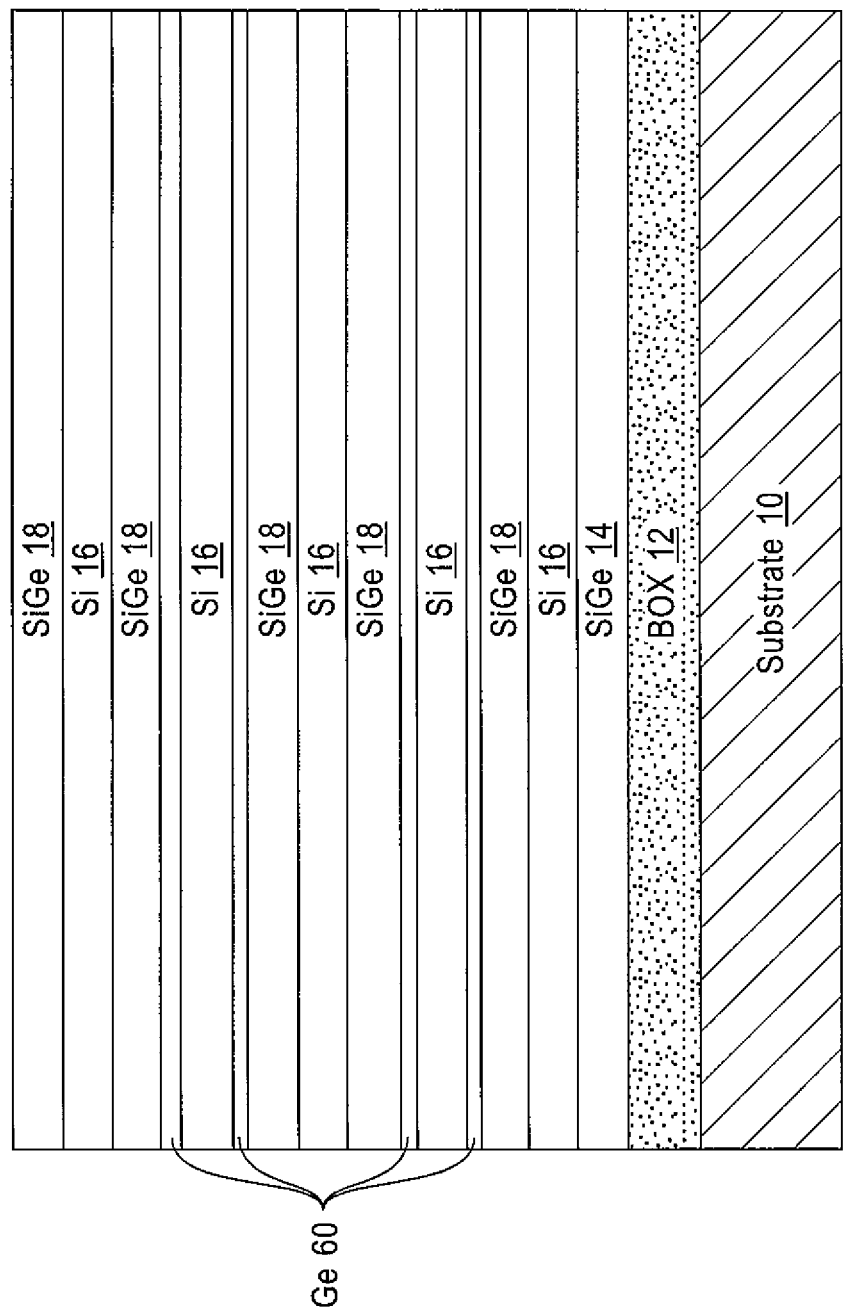

The third embodiment of this invention will now be described. FIG. 12 shows a result of the multi-layer deposition as in FIG. 1, but modified so as to include thin layers of Ge 60 that lie above two of the Si layers 16 that will, in the thick gate dielectric region 24B, eventually be removed. More specifically, the structure of FIG. 12 includes the substrate (e.g., a Si substrate) 10 having the overlying BOX layer 12 and the initial layer 14 of $Si_{1-x}Ge_x$, where x can be in a range of about 0.1 to about 0.35, with 0.2 being one suitable nominal value (although in other embodiments the layer 14 of SiGe could be formed directly on the substrate 10). On the initial layer 14 of $Si_{1-x}Ge_x$, there are formed by successive blanket deposition steps alternating layers of Si 16 and $Si_{1-x}Ge_x$, 18 (x equal to, for example, also about 0.2). In this embodiment there are five layer pairs formed from five layers of Si 16 and five layers of $Si_{1-x}Ge_x$, although there could fewer than five layers of each (e.g., three layers of each) or more than five layers of each. Each of the layers 14, 16 and 18 has a same nominal thickness of, for example, about 8 nm to about 10 nm. However, in this third embodiment between two of the Si layers 16 and adjacent top and bottom SiGe layers 18 there are deposited the Ge layers 60 having a thickness of, for example, about 2 nm to about 3 nm.

Figure 13:
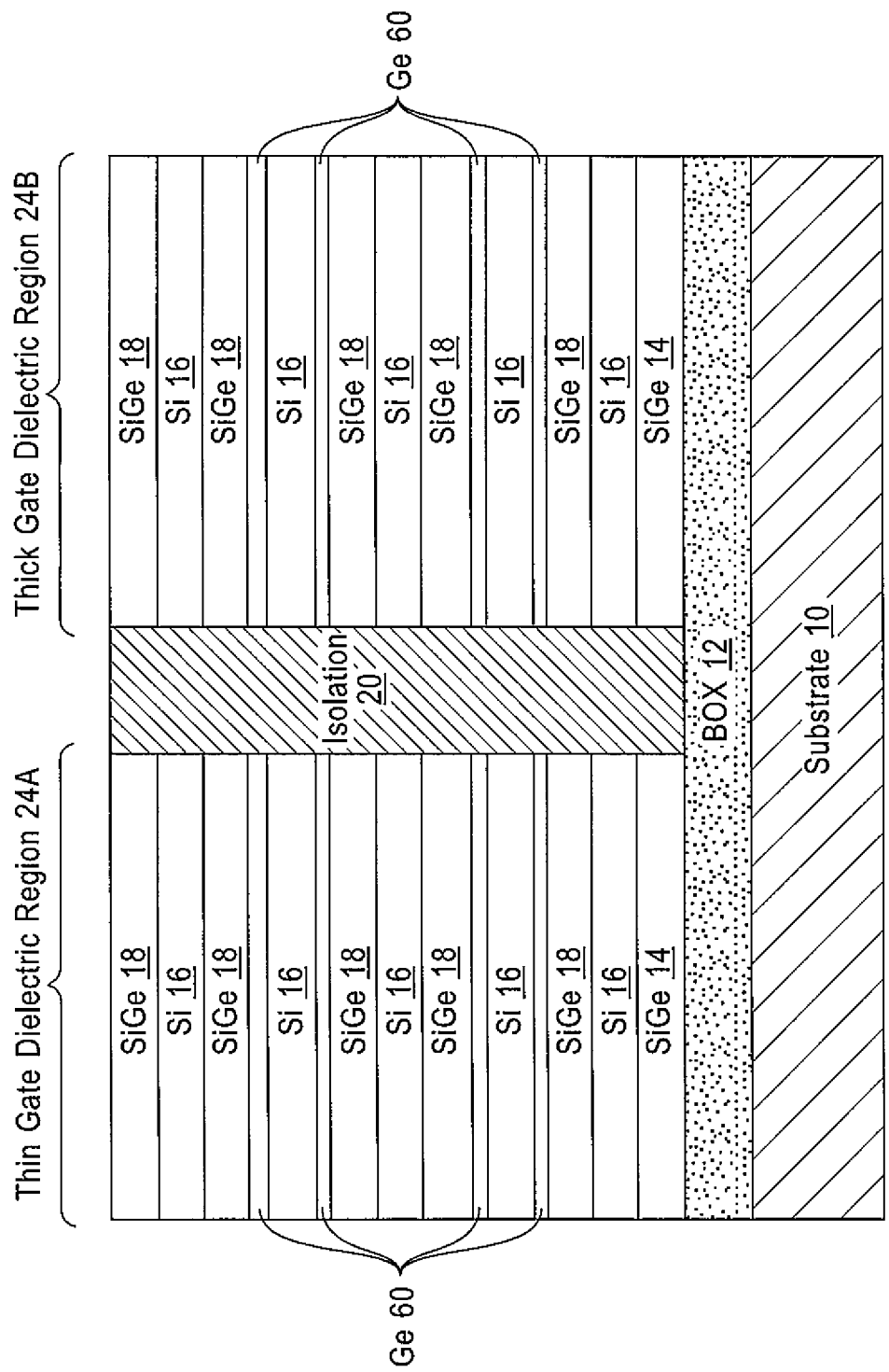

FIG. 13 shows the structure of FIG. 12 after providing the isolation 20, e.g., the STI structure, to separate the thin gate dielectric region 24A from the thick gate dielectric region 24B. The isolation 20 extends to the surface of the BOX 12.

Figure 14:
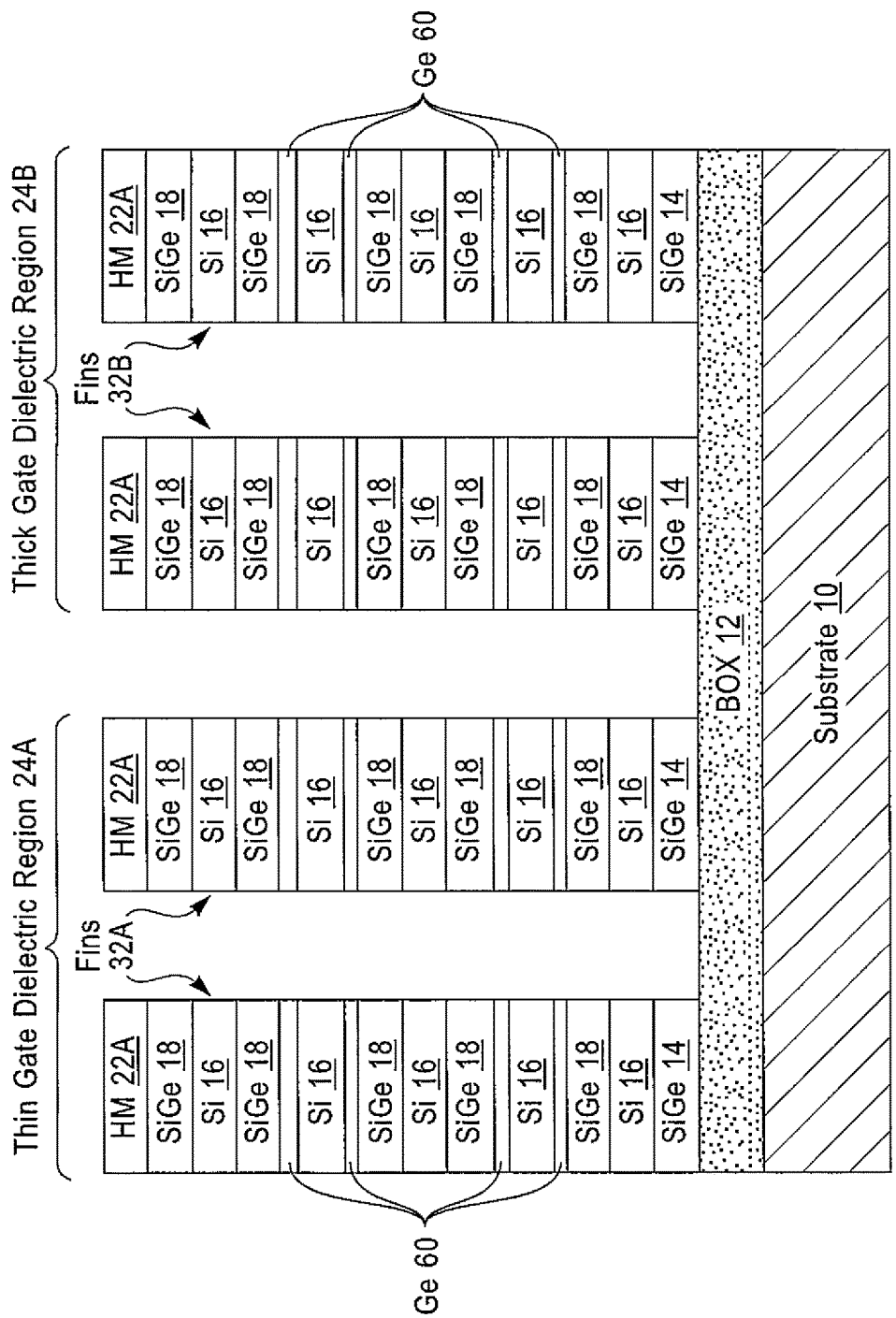

FIG. 14 shows the structure of FIG. 13 after applying the HM 22 and then patterning fins using lithography or sidewall image transfer and RIE. In the illustrated non-limiting example, as in the case of FIG. 4, two fins 32A are formed in the thin gate dielectric region 24A and two fins 32B are formed in the thick gate dielectric region 24B. More than two fins can be formed. The fin pitch and other dimensions can be comparable to the dimensions described for FIG. 4, keeping in mind that the fin height can be increased due to the presence of the additional Ge layers 60. Each of the fins 32A, 32B includes a portion 22A of the HM.

Figure 15:
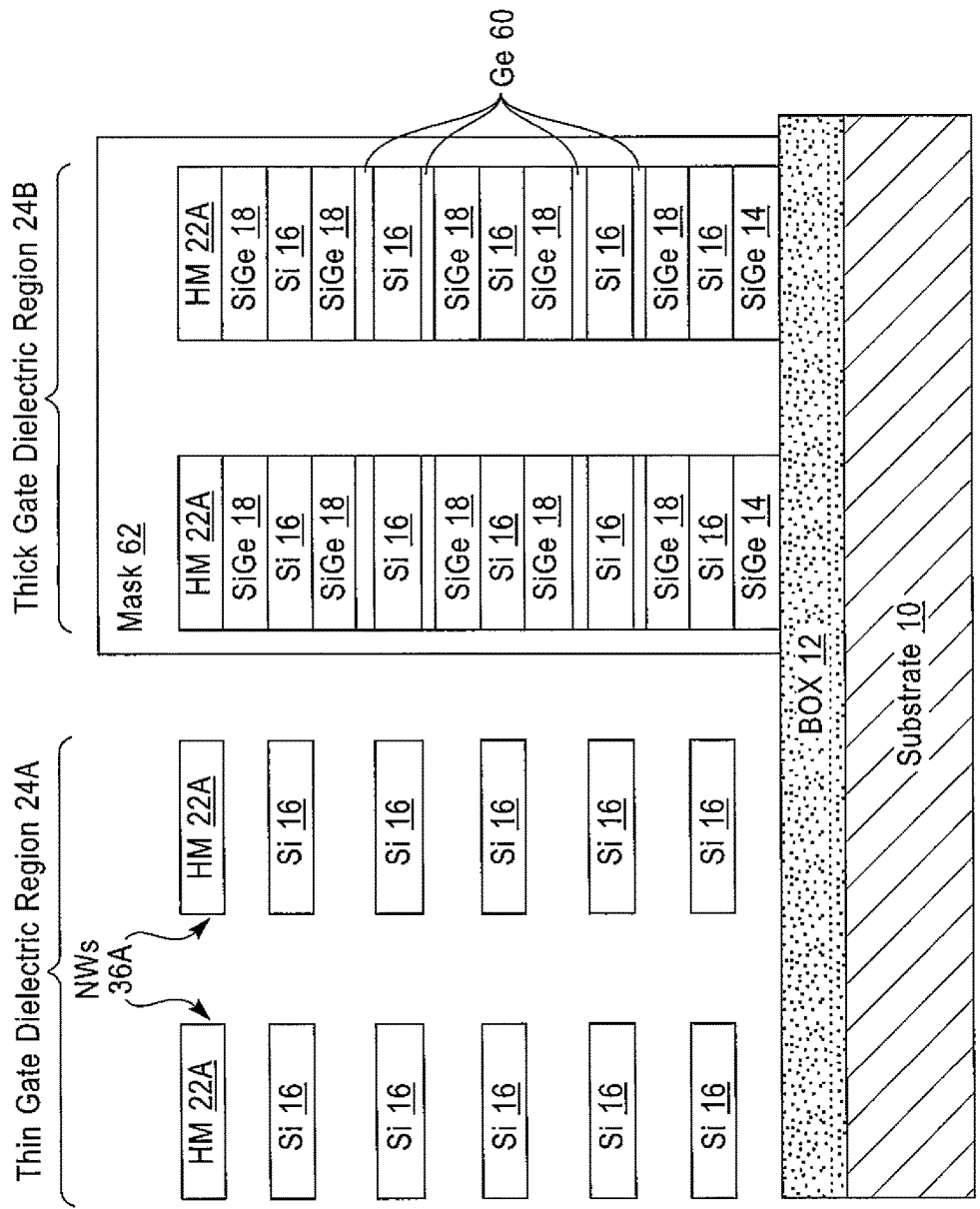

FIG. 15 shows the structure of FIG. 14 after applying a block mask 62 to protect the fins 32B in the thick gate dielectric region 24B, and then removing in the thin gate dielectric region 24A the SiGe layers 18 and the Ge layers 60 selective to the Si layers 16. The above-mentioned chemical vapor etch process with HCl can be used for this purpose. The result is the creation of the NWs 36A in the thin gate dielectric region 24A. As before, the NWs 36A are suspended and stacked vertically above the BOX 12 between the anchors 34A and 34B.

Figure 16:
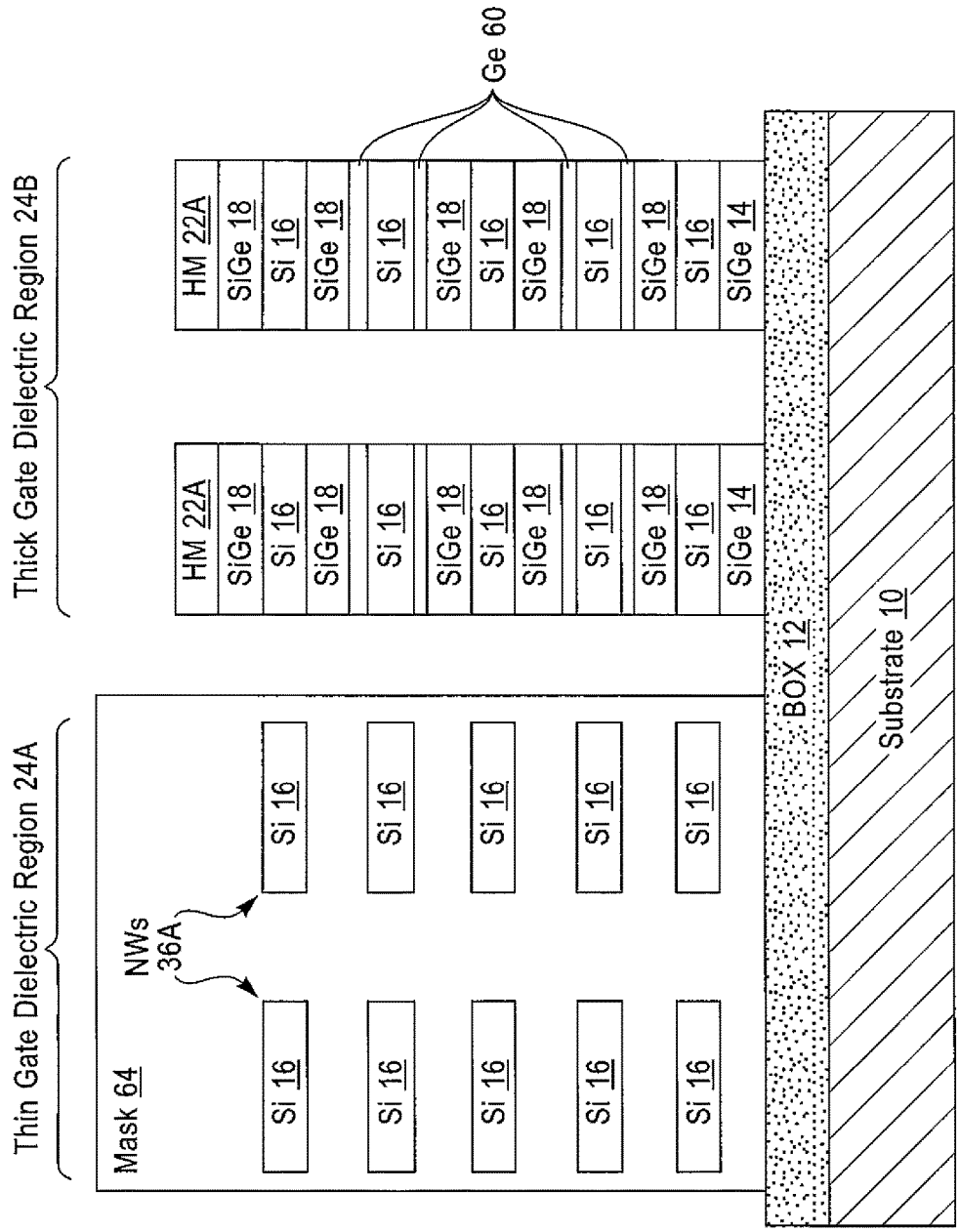

FIG. 16 shows the structure of FIG. 15 after removing the block mask 62 and applying a block mask 64 to cover the NWs 36A in the thin gate dielectric region 24. Next an anneal procedure is performed with a temperature selected to cause a Si/Ge intermix (e.g., about 800° C.) and thereby form SiGe (shown as the layers of SiGe 18A in FIG. 17)

from each pair of Ge layers 60 and the adjacent, interposed Si layer 16. However, the $Si_{1-x}Ge_x$ layers 18, where x is about 0.2, and an adjacent Si layer 16 do not intermix at the anneal temperature. As a result only those Si layers 16 in direct contact with a Ge layer 60 are converted to SiGe and can then be etched away.

In general, a range of suitable temperatures for the intermix anneal operation depends on the SiGe concentration being used for the layer 18. The range would typically not be wide, e.g., about +/−50° C. Outside of this temperature range, either a) no intermixing will occur (lower temperatures), or b) undesired intermixing will occur between the SiGe and Si (higher temperatures).

Figure 17:
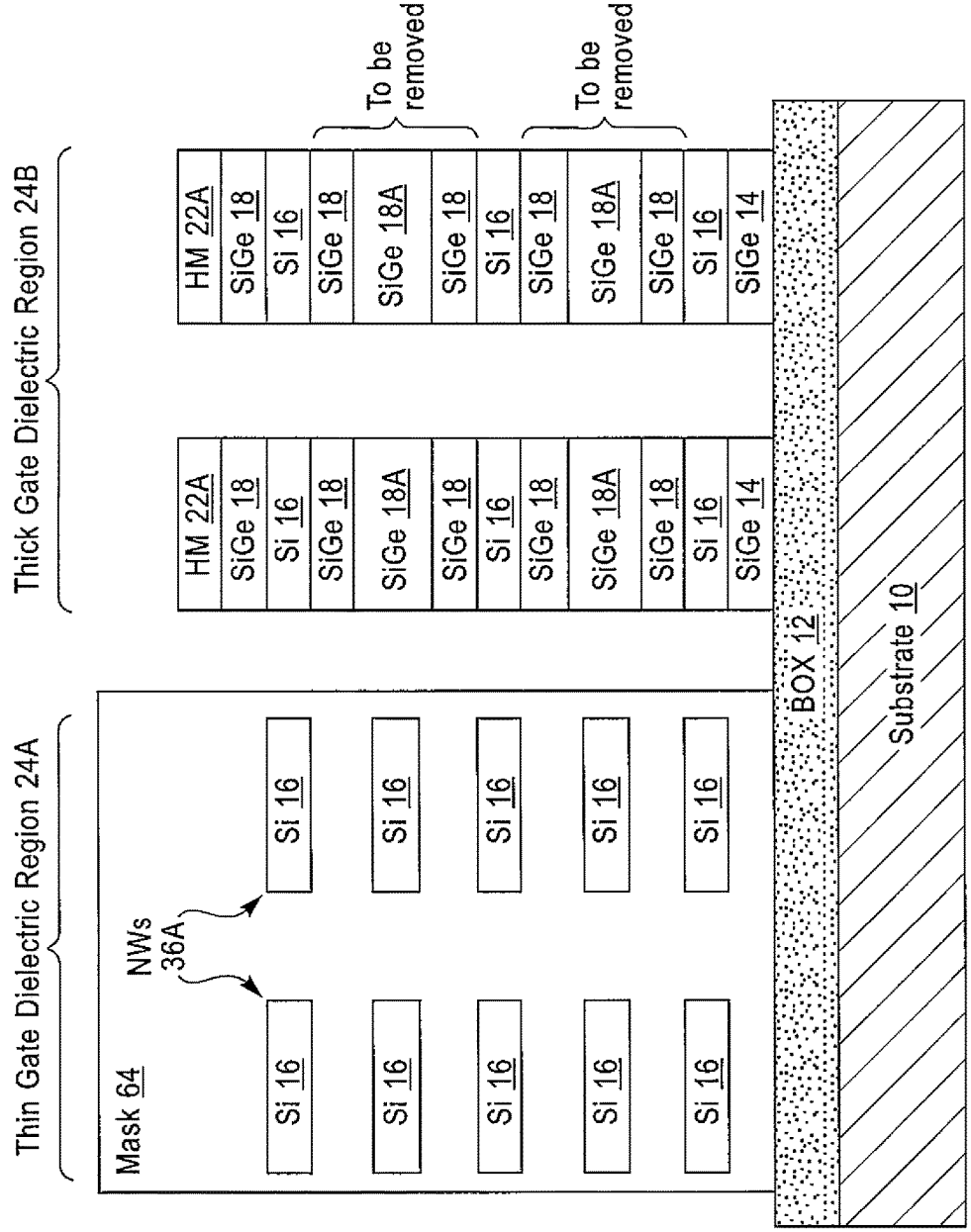

FIG. 17 shows the structure of FIG. 16 at the completion of the anneal process. The resultant SiGe layers 18A are shown disposed between SiGe layers 18 (to be removed), while those Si 16 layers that were not in direct contact with a Ge layer 60 remain intact.

Figure 18:
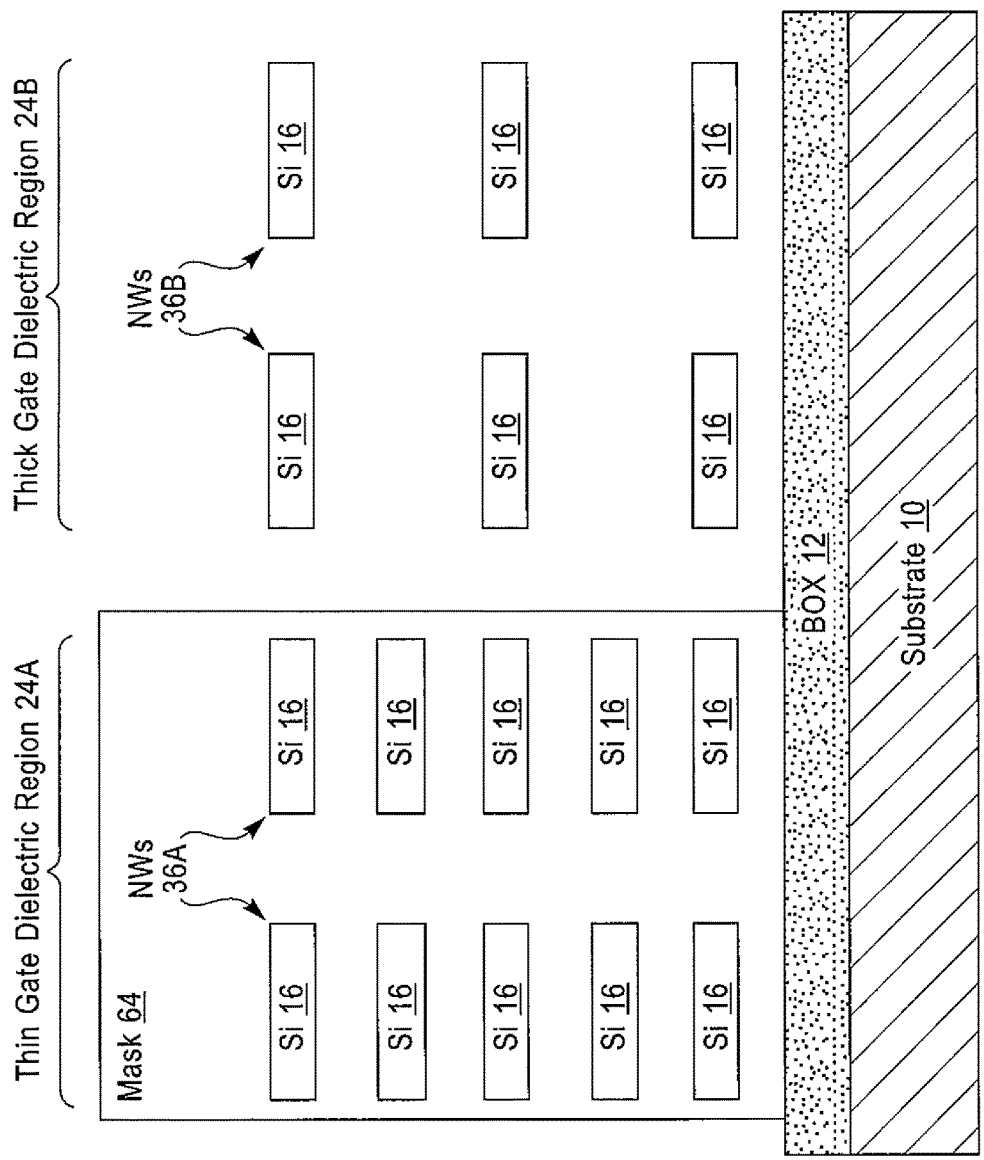

FIG. 18 shows the structure of FIG. 17 after performing an etch to remove the layers of SiGe 18 and SiGe 18A, leaving the Si layers 16 suspended one above another and stacked vertically above the BOX 12 between the thick gate dielectric region anchors. The etch removes the HM 22A and the SiGe layers 14, 18 and 18A selective to the Si layers 16. As before, the above-mentioned chemical vapor etch process with HCl can be used for this purpose. The result is the creation of the NWs 36B in the thick gate dielectric region 24B.

At this point in the process the mask 64 is removed and processing can continue as was described above for FIGS. 7-9 to perform HK, MG and thick gate dielectric (in the thick gate dielectric region 24B) deposition, dummy gate formation and removal, and metal fill steps. The end result is the formation of the first set of NW finFETs in the thin gate dielectric region 24A and the second set of NW finFETs in the thick gate dielectric region 24B.

It is noted that any one of the structures shown in FIGS. 1-18 could be viewed as an intermediate structure formed during the overall process of providing the stacked NW thin gate dielectric and thick gate dielectric finFETs.

It is to be understood that although the exemplary embodiments discussed above with reference to FIGS. 1-18 can be used on common variants of the FET device including, e.g., FET devices with multi-fingered FIN and/or gate structures and FET devices of varying gate width and length. Moreover, transistor devices can be connected to metalized pads or other devices by conventional ultra-large-scale integration (ULSI) metalization and lithographic techniques.

Integrated circuit dies can be fabricated with various devices such as a field-effect transistors, bipolar transistors, metal-oxide-semiconductor transistors, diodes, resistors, capacitors, inductors, etc. An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching processes, and anneal processes and temperatures may be used by those skilled in the art. Further, the exemplary embodiments are not intended to be limited to only those materials, metals, dielectric materials, insulators, layer thicknesses and the like that were specifically disclosed above. Any and all such and similar modifications of the teachings of this invention will still fall within the scope of this invention.

What is claimed is:

1. A structure, comprising:
    a substrate;
    a first set of fins disposed on the substrate, the first set of fins comprising a first stack comprised of a first plurality of vertically stacked first Si nanowires that are spaced apart by a first distance;
    a second set of fins disposed on the substrate comprised of a second plurality of vertically stacked second Si nanowires that are spaced apart by a second distance that is greater than the first distance, where in a given fin of the second set of fins there are fewer vertically stacked second Si nanowires than vertically stacked first Si nanowires in a given fin of the first set of fins, where the first set of fins and the second set of fins have approximately the same total thickness;
    a first oxide layer and a metal layer disposed on each of the first Si nanowires; and
    a second oxide layer and a metal layer disposed on each of the second Si nanowires, where the second oxide layer disposed on the second Si nanowires is thicker than the first oxide layer disposed on the first Si nanowires, and where the first oxide layer is comprised of a layer of high dielectric constant metal oxide and where the second oxide layer is comprised of a layer of silicon oxide having an overlying layer of high dielectric constant metal oxide.

2. The structure as in claim 1, where the first set of fins and the second set of fins are formed by a process that comprises:
  depositing a first plurality of layer pairs on the substrate, where each layer pair of the first plurality of layer pairs is comprised of a layer of Si having a first thickness and a layer of SiGe having a second thickness;
  removing in a region of the substrate where the second set of fins will be formed the deposited first plurality of layer pairs;
  depositing in the region a second plurality of layer pairs on the substrate, where at least one layer pair of the second plurality of layer pairs is comprised of layer of Si having the first thickness and at least one layer of SiGe having a third thickness that is greater than the first thickness;
  removing the layers of SiGe from the first plurality of layer pairs leaving a first plurality of vertically stacked first Si nanowires that are spaced apart by the first distance that corresponds to the second thickness;
  removing the layers of SiGe from the second plurality of layer pairs leaving a second plurality of vertically stacked second Si nanowires that are spaced apart by the second distance that corresponds to the third thickness; and
  forming the first oxide layer and the metal layer on each of the first Si nanowires and the second oxide layer and the metal layer on each of the second Si nanowires.

3. The structure as in claim 1, where the first set of fins and the second set of fins are formed by a process that comprises:
  depositing a plurality of layer pairs on the substrate, where each layer pair of the plurality of layer pairs is comprised of a layer of Si having a first thickness and a layer of SiGe having a second thickness;
  in a portion of the deposited layer pairs where the second set of fins will be formed, implanting Ge into at least one of the layers of Si so as to convert the implanted Si layer into a layer comprised of SiGe that is interposed between two adjacent layers of SiGe to form a thicker layer of SiGe having a third thickness;
  removing the layers of SiGe in a portion of the deposited layer pairs where the first set of fins will be formed leaving the first plurality of vertically stacked first Si nanowires that are spaced apart by the first distance, where the first distance corresponds to the second thickness;
  removing the layers of SiGe in the portion of the substrate where the second set of fins will be formed leaving the second plurality of vertically stacked second Si nanowires that are spaced apart by the second distance that corresponds to the third thickness; and
  forming the first oxide layer and the metal layer on each of the first Si nanowires and the second oxide layer and the metal layer on each of the second Si nanowires.

4. The structure as in claim 3, further comprising performing one of a solid-phase epitaxy or a solid-phase crystallization (SPE/SPC) operation at a predetermined temperature to heal implant-induced damage, where the predetermined temperature is less than about 700° C.

5. The structure as in claim 1, where the first set of fins and the second set of fins are formed by a process that comprises:
  depositing a plurality of layer pairs on the substrate, where each layer pair is comprised of a layer of Si having the first thickness and a layer of SiGe having the second thickness, and where depositing the plurality of layer pairs also deposits a first layer of Ge adjacent to a first surface of a layer of Si of at least one layer pair and a second layer of Ge adjacent to a second opposite surface of the layer of Si, where the layer of Si and the first and second layers of Ge are interposed between a first layer of SiGe and a second layer of SiGe, each layer of Ge having a third thickness that is less than the first and second thicknesses;
  forming the first set of fins in a first region of the deposited plurality of layers and the second set of fins a second region in a second region of the deposited plurality of layers;
  in the first set of fins, removing the layers of SiGe and the layers of Ge leaving the first plurality of vertically stacked first Si nanowires that are spaced apart by the first distance that is substantially equal to the second thickness plus the third thickness;
  in the second set of fins, performing an anneal at a predetermined temperature to intermix the layers of Ge with the layer of Si that is interposed between the layers of Ge, and the layers of SiGe, to form a layer of SiGe having a fourth thickness; and
  in the second set of fins, removing the layers of SiGe leaving the second plurality of vertically stacked second Si nanowires that are spaced apart by the second distance that is substantially equal to the third thickness plus the fourth thickness.

6. The structure as in claim 2, where the first thickness is about 8 nm to about 10 nm, where the second thickness is about 8 nm to about 10 nm, and where the third thickness is about three times the first thickness.

7. The structure as in claim 5, where the first thickness is about 8 nm to about 10 nm, where the second thickness is about 8 nm to about 10 nm, where the third thickness is about 2 nm to about 3 nm, and where the fourth thickness is about three times the first thickness.

8. The structure as in claim 1, where the metal layer disposed on each of the first Si nanowires extends vertically between adjacent Si nanowires in the first set of fins, and where the metal layer disposed on each of the second Si nanowires extends both vertically and horizontally between adjacent Si nanowires in the second set of fins.

9. A structure, comprising:
  a substrate;
  a first set of fins disposed on the substrate, the first set of fins comprising a first stack comprised of a first plurality of vertically stacked first Si nanowires that are spaced apart by a first distance;
  a second set of fins disposed on the substrate comprised of a second plurality of vertically stacked second Si nanowires that are spaced apart by a second distance that is greater than the first distance, where in a given fin of the second set of fins there are fewer vertically stacked second Si nanowires than vertically stacked first Si nanowires in a given fin of the first set of fins, where the first set of fins and the second set of fins have approximately the same total thickness;
  a first oxide layer and a metal layer disposed on each of the first Si nanowires, where the metal layer disposed on each of the first Si nanowires comprises at least one of TiN, TiC, TiAlC, TaN, TaC, TaAlC, TaSiN, HfN, W, Al, and Ru; and
  a second oxide layer and a metal layer disposed on each of the second Si nanowires, where the second oxide layer disposed on the second Si nanowires is thicker than the first oxide layer disposed on the first Si nanowires, and where the first oxide layer is comprised of a layer of high dielectric constant metal oxide and where the second oxide layer is comprised of a layer of silicon oxide having an overlying layer of high dielectric constant metal oxide.

10. The structure as in claim 9, where the metal layer disposed on each of the second Si nanowires comprises at least one of TiN, TiC, TiAlC, TaN, TaC, TaAlC, TaSiN, HfN, W, Al, and Ru.

\* \* \* \* \*